(12) United States Patent
Okutani et al.

(10) Patent No.: US 10,695,792 B2
(45) Date of Patent: Jun. 30, 2020

(54) SUBSTRATE PROCESSING METHOD AND SUBSTRATE PROCESSING APPARATUS

(71) Applicant: SCREEN Holdings Co., Ltd., Kyoto (JP)

(72) Inventors: Manabu Okutani, Kyoto (JP); Takashi Ota, Kyoto (JP); Hiroshi Abe, Kyoto (JP); Naohiko Yoshihara, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 233 days.

(21) Appl. No.: 15/471,405

(22) Filed: Mar. 28, 2017

(65) Prior Publication Data
US 2017/0282210 A1 Oct. 5, 2017

(30) Foreign Application Priority Data
Mar. 31, 2016 (JP) .................... 2016-072093

(51) Int. Cl.
| | |
|---|---|
| *B05B 3/02* | (2006.01) |
| *B05D 1/02* | (2006.01) |
| *B05D 1/00* | (2006.01) |
| *H01L 21/687* | (2006.01) |
| *H01L 21/67* | (2006.01) |

(52) U.S. Cl.
CPC ............... *B05D 1/002* (2013.01); *B05B 3/02* (2013.01); *H01L 21/67028* (2013.01); *H01L 21/67051* (2013.01); *H01L 21/68728* (2013.01)

(58) Field of Classification Search
CPC ..... B05B 3/02; B05D 1/002; H01L 21/67028; H01L 21/67051; H01L 21/68728; H01L 21/68764; H01L 21/67023; H01L 21/02631; H01L 21/0206

USPC ......................................................... 427/348
See application file for complete search history.

(56) References Cited

U.S. PATENT DOCUMENTS

| | | | | |
|---|---|---|---|---|
| 5,635,031 A | * | 6/1997 | Enkvist ..................... | D21F 7/00 162/199 |
| 2012/0298147 A1 | | 11/2012 | Kaneko ........................ | 134/30 |
| 2014/0127908 A1 | * | 5/2014 | Okutani ............ | H01L 21/02068 438/694 |
| 2014/0174483 A1 | * | 6/2014 | Miya ................. | H01L 21/67028 134/30 |

(Continued)

FOREIGN PATENT DOCUMENTS

| | | |
|---|---|---|
| JP | 2002-273360 A | 9/2002 |
| JP | 2009-111219 A | 5/2009 |

(Continued)

*Primary Examiner* — Alexander M Weddle
(74) *Attorney, Agent, or Firm* — Ostrolenk Faber LLP

(57) ABSTRACT

A processing liquid is supplied to an upper surface of a horizontally-held substrate to form a liquid film of the processing liquid that covers an entirety of the substrate upper surface. The substrate is heated to evaporate the processing liquid in contact with the upper surface of the substrate to form a gas phase layer between the upper surface of the substrate and the liquid film of the processing liquid. After the gas phase layer has been formed, a gas is blown onto the liquid film above the substrate to open a hole in the liquid film. The gas is blown onto a region inside the hole in the liquid film to move the liquid film on the gas phase layer. A direction of a gas stream at a substrate outer peripheral portion is changed to remove the liquid film at the substrate outer peripheral portion.

15 Claims, 23 Drawing Sheets

(56) References Cited

U.S. PATENT DOCUMENTS

2015/0243542 A1  8/2015  Yoshihara et al.
2016/0214148 A1  7/2016  Okutani et al. .................. 134/19

FOREIGN PATENT DOCUMENTS

| JP | 2012-244129 | 12/2012 |
| JP | 2013-172080 | 9/2013 |
| JP | 2015-185804 A | 10/2015 |
| TW | 201638993 A | 11/2016 |

\* cited by examiner

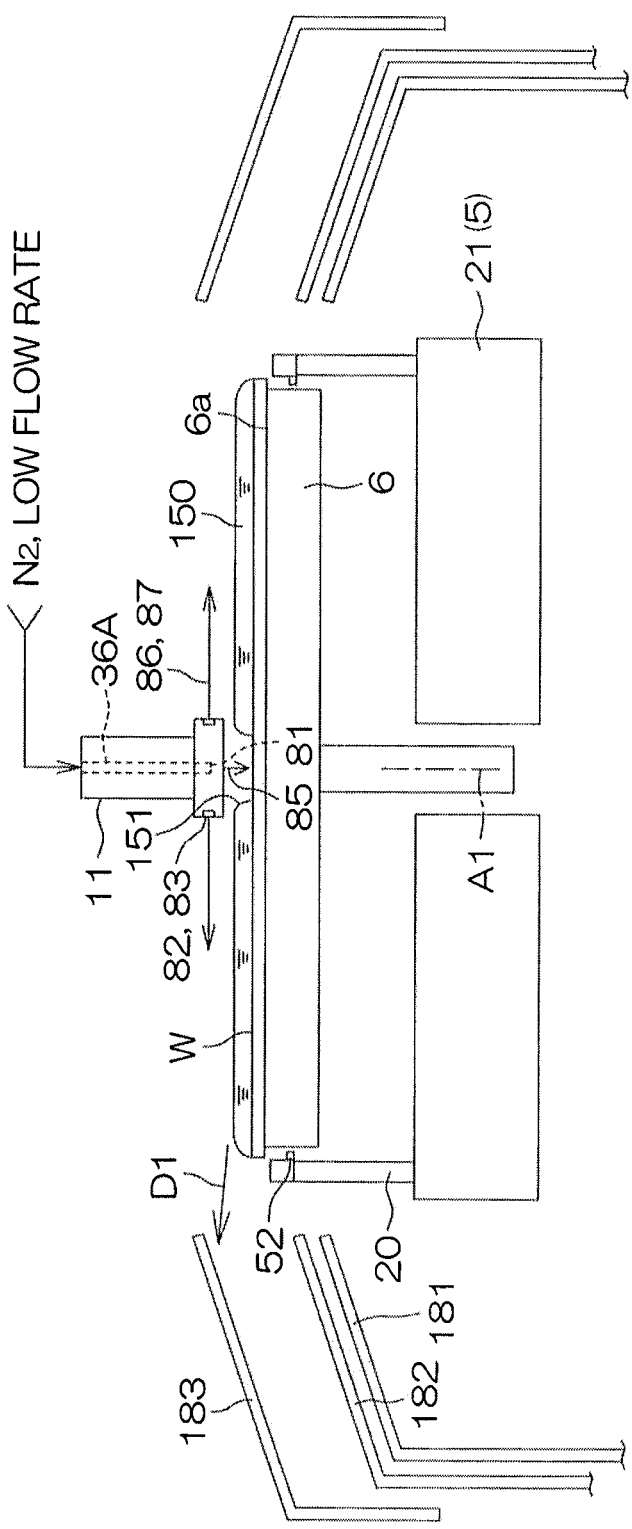

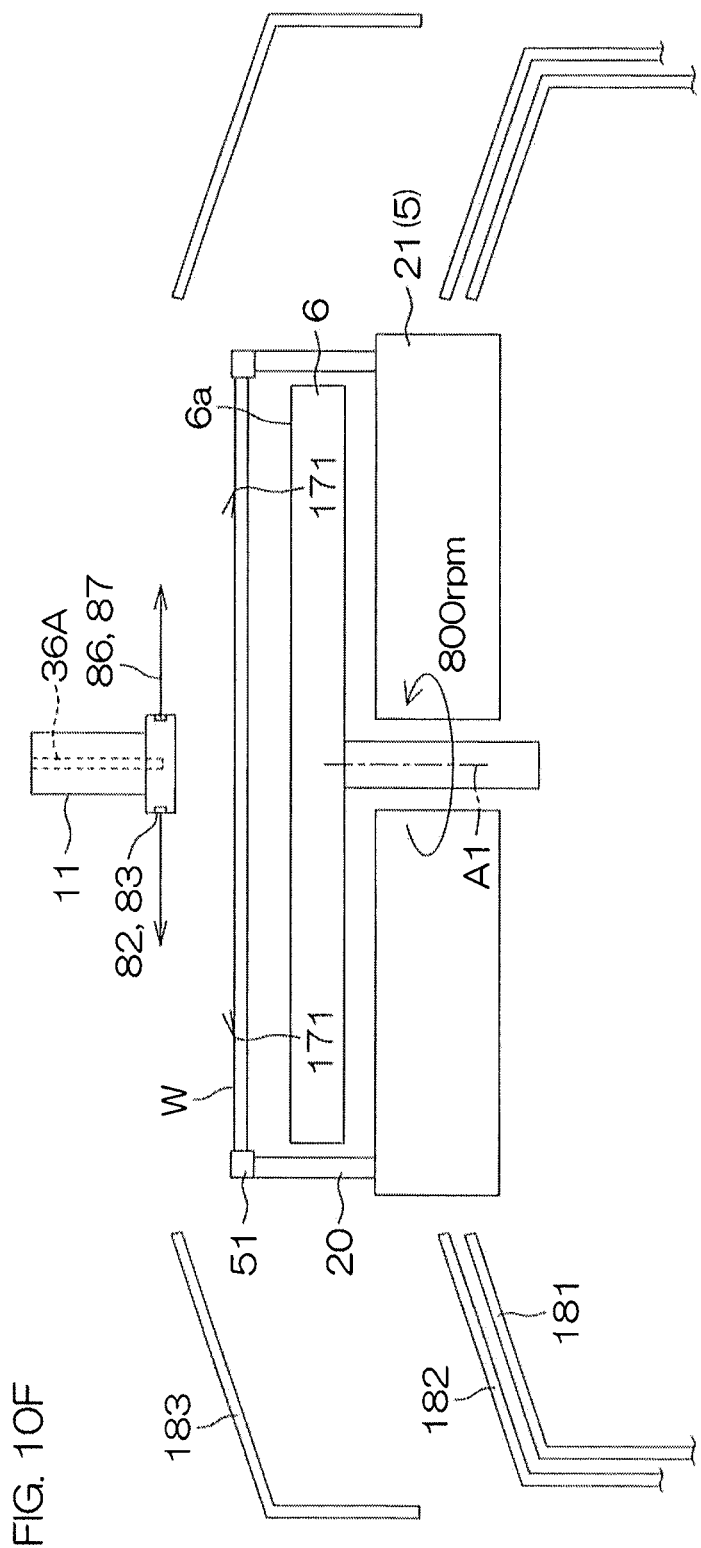

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus for processing a substrate. Examples of substrates to be processed include semiconductor wafers, substrates for liquid crystal displays, substrates for plasma displays, substrates for FEDs (Field Emission Displays), substrates for optical disks, substrates for magnetic disks, substrates for magneto-optical disks, substrates for photomasks, ceramic substrates, substrates for solar cells, etc.

2. Description of the Related Art

United States Patent Application Publication No. 2014/127908 discloses a prior art related to a substrate processing method and a substrate processing apparatus for cleaning a substrate, having formed thereon a fine pattern of high aspect ratio. In this prior art, after a rinse processing by a rinse liquid, the rinse liquid on the substrate is replaced by an organic solvent. Further, while horizontally holding and rotating the substrate, a heater is brought close to a lower surface of the substrate to heat the substrate and make the organic solvent in contact with the substrate evaporate to form a gas phase layer. A liquid film of the organic solvent is maintained on the gas phase layer. From that state, the organic solvent liquid film is moved on the gas phase layer to remove the organic solvent from above the substrate.

Thus with the prior art, the rinse liquid on the substrate is replaced by the organic solvent of lower surface tension. Further, by the liquid film of the organic solvent being supported by the gas phase layer, a liquid surface of the organic solvent is lifted higher than the fine pattern so that the surface tension of the organic solvent does not act on the fine pattern. The organic solvent is expelled off the substrate in that state. The substrate is thus dried while suppressing or preventing collapse of the fine pattern due to the surface tension of the rinse liquid or the organic solvent.

SUMMARY OF THE INVENTION

However, with the prior art, the substrate is rotated in the process of heating the substrate and therefore an interval must be secured between the substrate and the heater and due to this, heating takes time. A long time is thus required from the start of heating until a gas-liquid interface (interface between the gas phase layer and the liquid film) floats outside the fine pattern. Surface tension thus acts for a long time on the fine pattern from the gas-liquid interface and therefore pattern collapse may occur. Needless to say, improvement of productivity is restricted because heating for a long time is required.

Although this problem can be solved by putting the heater in contact with the lower surface of the substrate when heating the substrate, the substrate cannot be rotated in the contacting state. If the rotation is stopped, a centrifugal force cannot be used to remove the liquid film and the movement of the liquid film may stop at an outer peripheral portion of the substrate. The organic solvent constituting the stopped liquid film is lost by evaporation and the liquid film may disappear partially to give rise to cracks in the liquid at random positions. The behavior of the liquid film may become unstable accordingly and cause collapse of the fine pattern.

It may be considered to stop the rotation of the substrate and meanwhile blow an inert gas at a high flow rate onto a substrate front surface to sweep off the liquid film at the substrate outer peripheral portion. However, the blowing-on of the inert gas at the high flow rate may cause decreases of temperatures of the substrate and the liquid film and loss of the gas phase layer. In such a case, the liquid of the organic solvent may enter into an interior of the fine pattern and the surface tension may act on the fine pattern and lead to pattern collapse.

It may also be considered to separate the heater from the substrate and perform rotation to promote the movement of the liquid film by centrifugal force at a point at which the liquid film has moved to the outer peripheral portion. However, separation of the heater from the substrate may cause decrease of temperature of the liquid film and loss of the gas phase layer. Moreover, by the rotation of the substrate, the substrate and the liquid film undergo relative movement with respect to a peripheral atmosphere so that heat of the substrate and the liquid film is taken away by the atmosphere to cause temperature decrease and thereby cause loss of the gas phase layer. The liquid of the organic solvent may thus enter into the interior of the fine pattern and the surface tension may act on the fine pattern and lead to pattern collapse.

An object of the present invention is thus to provide a substrate processing method and a substrate processing apparatus by which a front surface of the substrate can be dried while reducing influences of surface tension on a fine pattern on the front surface of the substrate.

A preferred embodiment of the present invention provides a substrate processing method including a liquid film forming step of supplying a processing liquid to an upper surface of a horizontally-held substrate to form a liquid film of the processing liquid covering an entirety of the upper surface of the substrate, a gas phase layer forming step of heating the substrate by a substrate heating unit to evaporate the processing liquid in contact with the upper surface of the substrate, to forma gas phase layer between the upper surface of the substrate and the processing liquid and maintain the liquid film on the gas phase layer, a gas removing step of blowing a gas onto the liquid film at the upper surface of the substrate after the forming of the gas phase layer to partially remove the processing liquid to open a hole in the liquid film and further spread the hole to an outer periphery of the substrate, and to move the liquid film on the gas phase layer to remove the processing liquid, constituting the liquid film, off the substrate, and a gas stream direction changing step whereby a direction of a gas stream, which, in a vicinity of an outer peripheral portion of the substrate, flows toward an outer side of the substrate, is changed from a first direction to a second direction directed more downwardly than the first direction to promote movement of the liquid film at the outer peripheral portion of the substrate and urge the removal of the liquid film off the substrate. Here, "direction of a gas stream" specifically refers to a main flow direction (average flow direction) of the gas stream in the vicinity of the outer peripheral portion of the substrate.

With the present method, by heating the substrate, the gas phase layer, resulting from evaporation of the processing liquid in contact with the upper surface of the substrate, is formed, and the liquid film of the processing liquid is maintained on the gas phase layer. That is, the liquid film of the processing liquid is maintained in a state of floating above the upper surface of the substrate. In this state, the gas is blown onto the liquid film to open a hole and spread the hole toward the outer periphery of the substrate to move and expel the liquid film in the floating state off the substrate. Surface tension applied by the processing liquid on a fine pattern on the substrate can thereby be suppressed and pattern collapse can thus be suppressed or prevented. On the other hand, the direction of the gas stream directed toward the outer side of the substrate in the vicinity of the outer peripheral portion of the substrate is changed from the first direction to the more downwardly directed second direction. The gas stream that is changed in direction to the second direction acts on the liquid film and promotes the movement thereof. Retention of the liquid film at the outer peripheral portion of the substrate can thereby be suppressed or prevented and the liquid film can be expelled smoothly off the substrate while suppressing the stopping of the movement of the liquid film above the substrate. Collapse of the pattern on the substrate front surface can thereby be suppressed or prevented more reliably.

Preferably, the substrate is maintained in a non-rotating state until the liquid film maintained on the gas phase layer is expelled outside the substrate. Decrease of temperature of the liquid film or the substrate due to heat exchange between the liquid film and atmosphere can thereby be suppressed and therefore the liquid film can be expelled off the substrate while avoiding disappearance of the gas phase layer. Pattern collapse can thereby be avoided more reliably. Also, by maintaining the substrate in the non-rotating state, the substrate can be heated efficiently in a state where the substrate heating unit is contacted with the substrate and the heating in the contacting state can be sustained until the entire liquid film is removed off the substrate. It is thereby made easy to keep the gas phase layer on the substrate until the entire liquid film is removed and accordingly, pattern collapse can be avoided more reliably.

In the preferred embodiment of the present invention, the second direction includes a component directed more downwardly than a horizontal direction. The gas stream of the second direction is thereby made to act so that the liquid film above the substrate is dragged down off the substrate. Stagnation of the liquid film at the outer peripheral portion of the substrate can thereby be suppressed or avoided more reliably and pattern collapse can be suppressed accordingly.

In the preferred embodiment of the present invention, the substrate processing method includes a substrate rotating step of rotating the substrate, a guard side positioning step of positioning a guard, which receives the processing liquid removed to the outer side from the substrate, at a side of the substrate being rotated by the substrate rotating step, and an evacuating step of evacuating an inner side of the guard, and the gas stream direction changing step includes a guard relative position changing step of vertically moving the guard relative to the substrate while sustaining the evacuating step in a state where the substrate rotating step is ended and the rotation of the substrate is stopped.

The guard relative position changing step is a step of vertically moving at least one of the guard and the substrate to change a relative height of the guard and the substrate.

By thus changing the position of the guard that is arranged to receive the processing liquid, the direction of the gas stream in the vicinity of the outer peripheral portion of the substrate can be changed. A part dedicated to changing the direction of the gas stream thus does not have to be provided. Moreover, the guard arranged to receive the processing liquid removed from the rotating substrate faces an entirety of a peripheral end surface of the substrate and therefore the direction of the gas stream can be changed similarly across an entire perimeter of a periphery of the substrate by moving the guard vertically. Stagnation of the processing liquid at the outer peripheral portion of the substrate can thereby be suppressed or avoided even more reliably.

In the preferred embodiment of the present invention, the guard relative position changing step includes a guard lowering step of lowering an upper end height of the guard to a height not higher than a height of the substrate.

A gas stream can thereby be formed that is directed downward from the peripheral end surface of the substrate and therefore the liquid film can be dragged down from the upper surface of the substrate. The stagnation of the liquid film at the outer peripheral portion of the substrate can thereby be avoided more effectively by using the gas stream and gravity.

In the preferred embodiment of the present invention, the substrate heating unit includes a heater unit which has a heating surface arranged so as to be contactable and separatable from a lower surface of the substrate, the gas phase layer forming step includes a heating surface contacting step of putting the heating surface of the heater unit in contact with the lower surface of the substrate, and the heating surface contacting step is sustained until the liquid film of the processing liquid is removed from the front surface of the substrate.

The heating surface of the heater unit is thereby put in contact with the lower surface of the substrate until the liquid film of the processing liquid is removed and therefore the gas phase layer at the upper surface of the substrate can be kept until all of the liquid film of the processing liquid is removed. The surface tension of the processing liquid can thereby be reliably suppressed or prevented from acting on the pattern on the substrate. Moreover, the temperature of the substrate can be raised quickly because the substrate is heated with the heating surface being put in contact therewith and accordingly, the gas phase layer can be formed quickly on the substrate. The time during which the gas-liquid interface of the processing liquid contacts the pattern can thereby be shortened and pattern collapse can thus be suppressed further. In addition, the heating time can be shortened and therefore productivity can be improved.

In the preferred embodiment of the present invention, the gas removing step includes a gas flow rate increasing step of increasing a flow rate of the gas. The liquid film can thereby be moved while more reliably suppressing the stopping of the movement of the liquid film above the substrate.

In the preferred embodiment of the present invention, the gas stream direction changing step is executed in parallel to the gas flow rate increasing step. The stopping of the movement of the liquid film above the substrate can thereby be suppressed more reliably.

In the preferred embodiment of the present invention, the gas stream direction changing step is started later than the start of the gas flow rate increasing step. The direction of the gas stream is thereby changed in a state where the processing liquid has been mostly removed and the hole has been spread to the outer peripheral portion of the substrate, and the gas stream that is changed in direction acts effectively on the liquid film remaining at the outer peripheral portion. The stopping of the movement of the processing liquid can thereby be suppressed more reliably.

In the preferred embodiment of the present invention, the gas stream direction changing step is executed later than the opening of a hole in the liquid film of the processing liquid. Splitting of the liquid film due to a force that the gas stream applies to the liquid film can thereby be avoided and the liquid film can be removed while enlarging the hole by means of the gas stream. The stopping of the movement of the liquid film can thereby be suppressed reliably while avoiding the splitting of the liquid film.

In the preferred embodiment of the present invention, the gas removing step includes a step of opening a hole in the liquid film by positioning a nozzle which discharges the gas, at a close position of being brought close to the upper surface of the substrate and discharging the gas from the nozzle, and a step of spreading the hole by positioning the nozzle at a gas removing position which is higher than the close position and discharging the gas from the nozzle.

By thereby discharging the gas at the position close to the substrate, the hole can be opened in the liquid film with a gas of low flow rate. Loss of the gas phase layer in the hole opening step can thereby be avoided. On the other hand, when the hole is to be spread, the gas is discharged from the gas removing position away from the substrate. The loss of the gas phase layer can thereby be suppressed even when the flow rate of the gas is increased and therefore the movement of the liquid film on the gas phase layer can be assisted by the gas.

The present invention further provides a substrate processing apparatus, including a substrate holding unit which holds a substrate horizontally, a processing liquid supplying unit which supplies a processing liquid to an upper surface of the substrate held by the substrate holding unit, a substrate heating unit which heats the substrate held by the substrate holding unit, a gas supplying unit which blows a gas onto the substrate held by the substrate holding unit, a gas stream direction changing unit, whereby a direction of a gas stream, which, in a vicinity of an outer peripheral portion of the substrate held by the substrate holding unit, flows toward an outer side of the substrate, is changed from a first direction to a second direction directed more downwardly than the first direction, and a controller which controls the processing liquid supplying unit, the substrate heating unit, the gas supplying unit, and the gas stream direction changing unit. The controller is programmed to execute a liquid film forming step of supplying a processing liquid from the processing liquid supplying unit to the upper surface of the substrate held by the substrate holding unit to form a liquid film of the processing liquid covering an entirety of the upper surface of the substrate, a gas phase layer forming step of heating the substrate by the substrate heating unit to evaporate the processing liquid in contact with the upper surface of the substrate, form a gas phase layer between the upper surface of the substrate and the processing liquid and maintain the liquid film on the gas phase layer, a gas removing step of blowing the gas from the gas supplying unit onto the liquid film after the forming of the gas phase layer to partially remove the processing liquid to open a hole in the liquid film and further spread the hole to an outer periphery of the substrate, and to move the liquid film on the gas phase layer to remove the processing liquid, constituting the liquid film, off the substrate, and a gas stream direction changing step of changing the direction of the gas stream in the vicinity of the outer peripheral portion of the substrate from the first direction to the second direction by means of the gas stream direction changing unit to promote movement of the liquid film at the outer peripheral portion of the substrate and urge the removal of the liquid film off the substrate.

In the preferred embodiment of the present invention, the substrate processing apparatus includes a substrate rotating unit which rotates the substrate held by the substrate holding unit, a guard which is positioned at a side of the substrate held by the substrate holding unit and receives liquid splashing to the side from the substrate due to the rotation of the substrate, and an evacuating unit which evacuates an inner side of the guard. The gas stream direction changing unit includes a guard relative position changing unit which moves the guard vertically relative to the substrate held by the substrate holding unit to change a relative position of the substrate and the guard.

In the preferred embodiment of the present invention, the substrate heating unit includes a heater unit which has a heating surface arranged so as to be contactable and separatable from a lower surface of the substrate held by the substrate holding unit, and the controller is programmed to execute, in the gas phase layer forming step, a heating surface contacting step of putting the heating surface of the heater unit in contact with the lower surface of the substrate, and to sustain the heating surface contacting step until the liquid film of the processing liquid is removed from the front surface of the substrate.

The above and other elements, features, steps, and characteristics and advantages of the present invention will become more apparent from the following detailed description of preferred embodiments with reference to the attached drawings.

Each of FIG. 10A to FIG. 10E is an illustrative sectional views for describing conditions of a step in the organic solvent processing.

Figure 8:
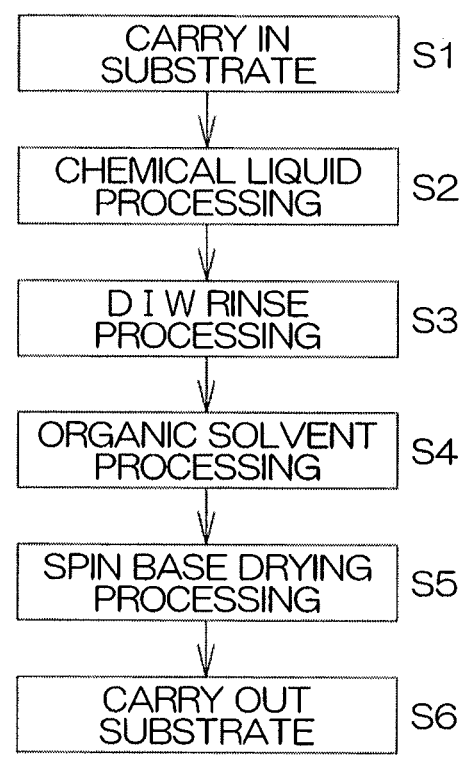
FIG. 8 is a flow diagram for describing an example of substrate processing by the substrate processing apparatus.

FIG. 10F is an illustrative sectional view for describing conditions of a spin base drying processing (S5 of FIG. 8).

Figure 11A:
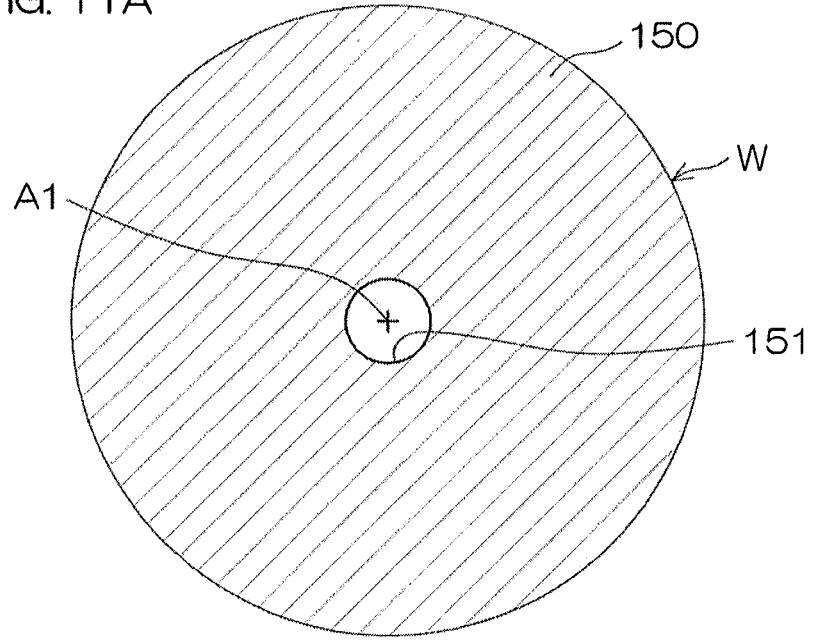
Figure 11B:
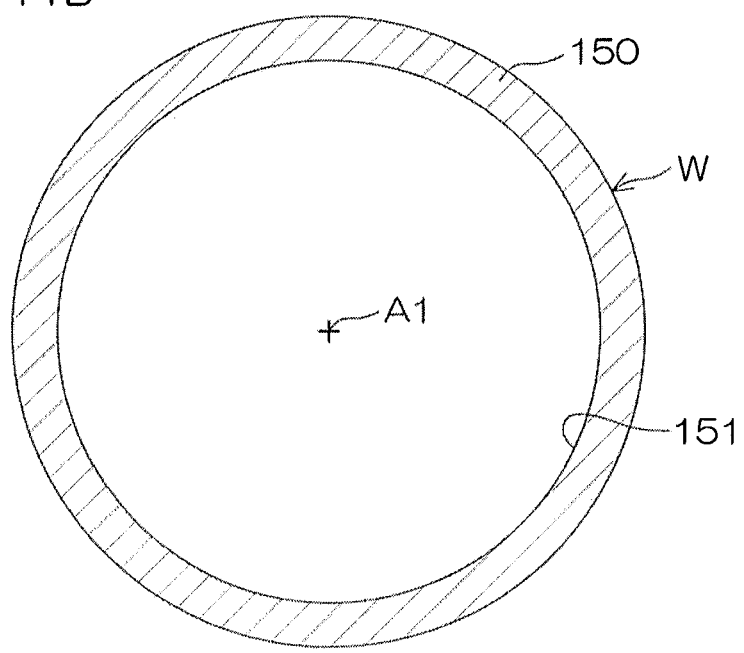

FIG. 11A is a plan view of the state of a liquid film in a hole opening step. FIG. 11B is a plan view of a state where a hole in the liquid film has spread to an outer peripheral portion.

Figure 12A:
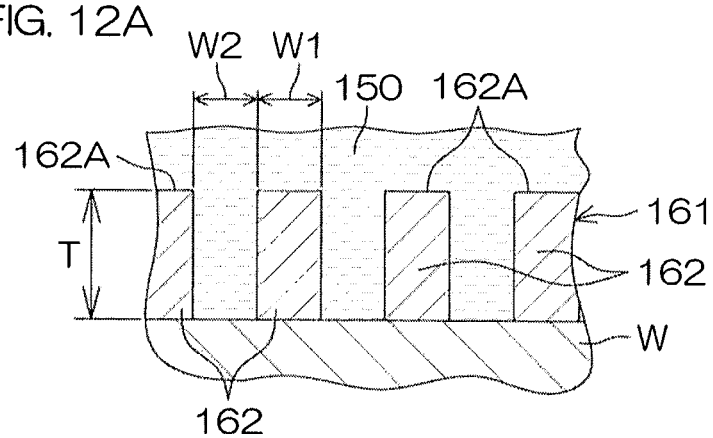
Figure 12B:
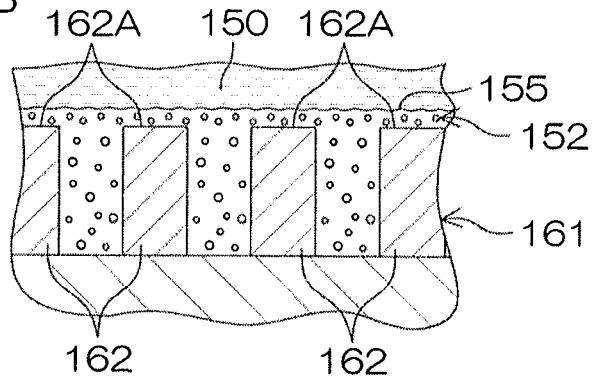
Figure 12C:
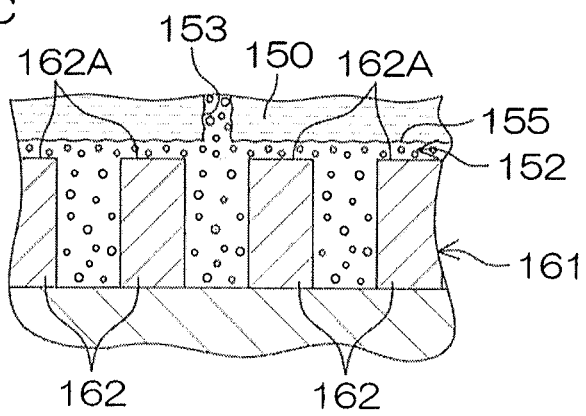

FIG. 12A and FIG. 12B are illustrative sectional views for describing the forming of a gas phase layer on a front surface of a substrate, and FIG. 12C is a sectional view for describing the splitting of a liquid film.

Figure 13A:
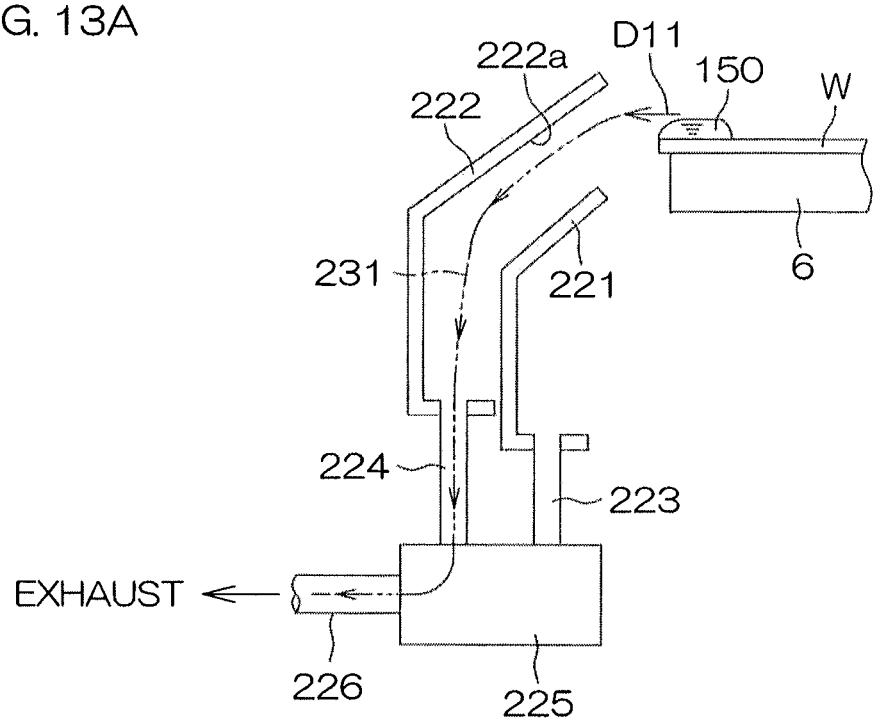
Figure 13B:
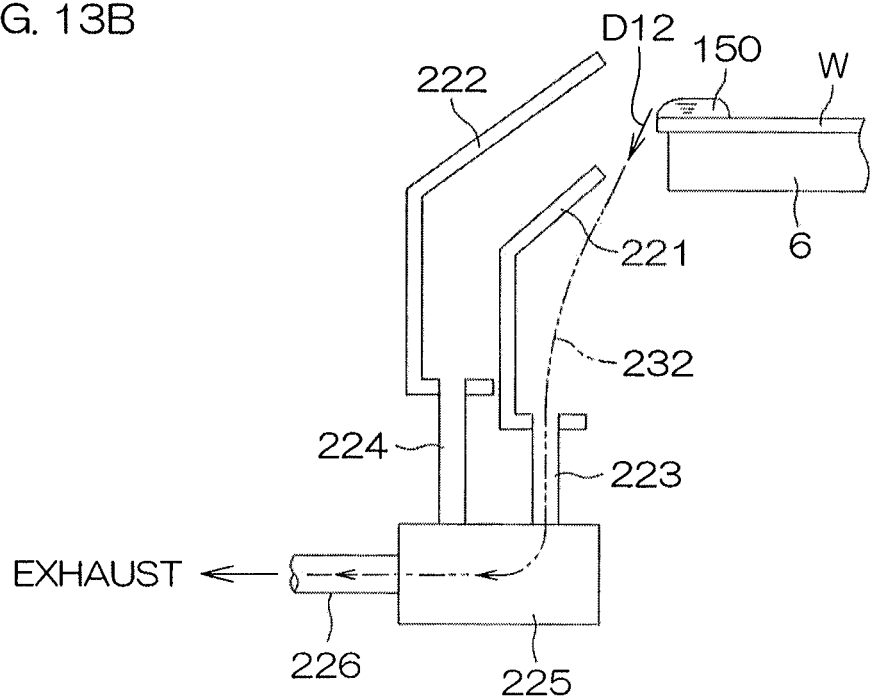

FIG. 13A and FIG. 13B are illustrative sectional views for describing the arrangement of a processing unit according to another preferred embodiment of the present invention and show another example of a gas stream direction changing step.

DETAILED DESCRIPTION OF THE PREFERRED EMBODIMENTS

Figure 1:
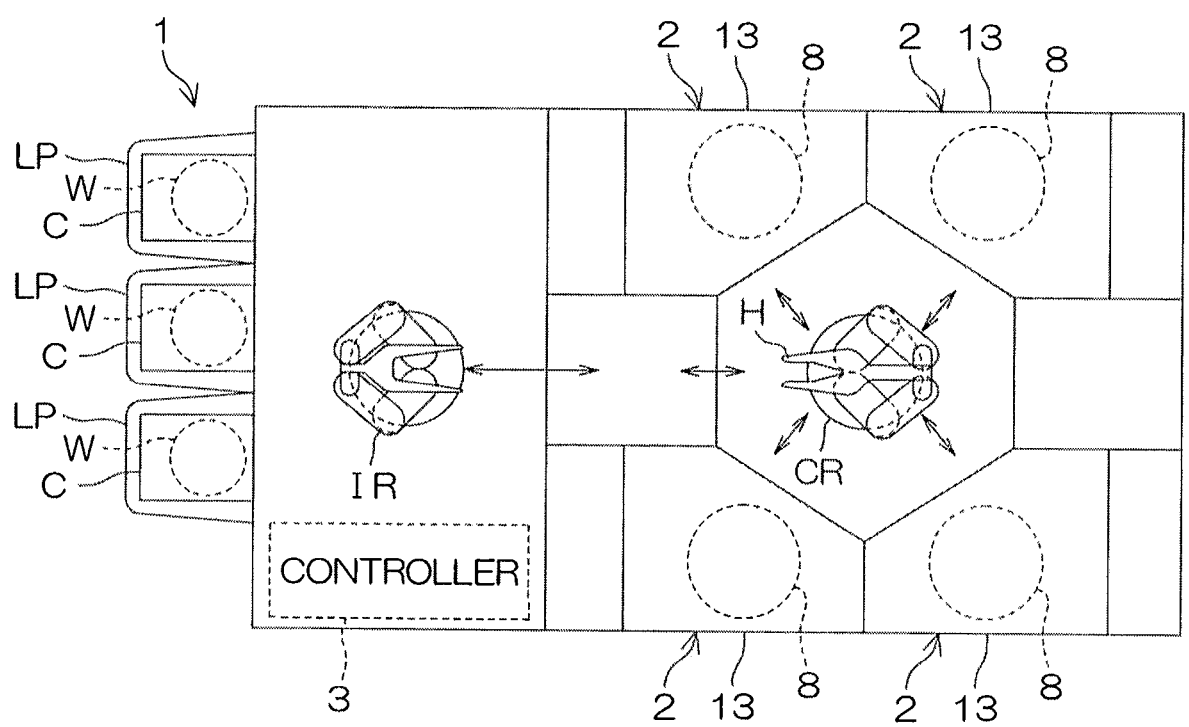
FIG. 1 is an illustrative plan view for describing a layout of an interior of a substrate processing apparatus according to a preferred embodiment of the present invention.

FIG. 1 is an illustrative plan view for describing a layout of an interior of a substrate processing apparatus according to a preferred embodiment of the present invention. The substrate processing apparatus 1 is a single substrate processing type apparatus that processes substrates W, such as silicon wafers, etc., one at a time. In the present preferred embodiment, the substrate W is a disk-shaped substrate. The substrate processing apparatus 1 includes a plurality of processing units 2 that process the substrates W by a processing liquid, load ports LP in which are placed carriers C that house the plurality of substrates W to be processed by the processing units 2, transfer robots IR and CR transferring the substrates W between the load ports LP and the processing units 2, and a controller 3 controlling the substrate processing apparatus 1. The transfer robot IR transfers the substrates W between the carriers C and the transfer robot CR. The transfer robot CR transfers the substrates W between the transfer robot IR and the processing units 2. The plurality of processing units 2 have, for example, the same arrangement.

Figure 2:
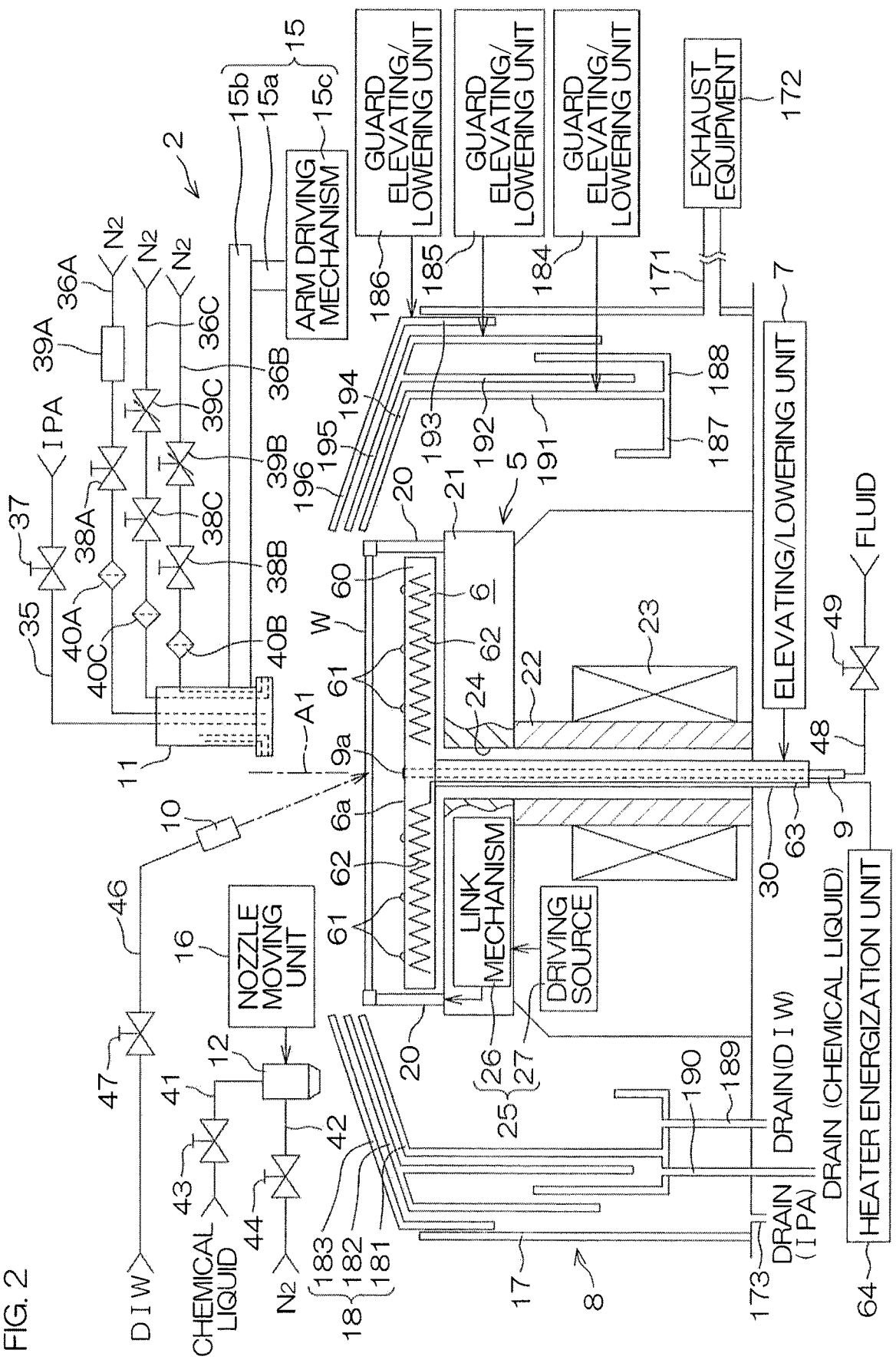
FIG. 2 is an illustrative sectional view for describing an arrangement example of a processing unit included in the substrate processing apparatus.

FIG. 2 is an illustrative sectional view for describing an arrangement example of a processing unit 2. The processing unit 2 includes a spin chuck 5 rotating a single substrate W around a vertical rotational axis A1 passing through a central portion of the substrate W while holding the substrate W in a horizontal orientation, a heater unit 6 heating the substrate W from a lower surface (lower side major surface) side, a elevating/lowering unit 7 that moves the heater unit 6 vertically under the substrate, a cylindrical cup 8 surrounding the spin chuck 5, a lower surface nozzle 9 supplying a processing fluid to a lower surface of the substrate W, a DIW nozzle 10 supplying deionized water (DIW) as a rinse liquid to an upper surface (upper side major surface) of the substrate W, a first moving nozzle 11 capable of moving above the substrate W, and a second moving nozzle 12 capable of moving above the substrate W. The processing unit 2 further includes a chamber 13 (see FIG. 1) that houses the cup 8, etc. Although unillustrated, the chamber 13 has formed therein a carry-in/carry-out port for carrying in and carrying out of the substrate W and includes a shutter unit that opens and closes the carry-in/carry-out port.

The spin chuck 5 is a substrate holding unit that holds the substrate W and is a substrate rotating unit that rotates the substrate W. Specifically, the spin chuck 5 includes chuck pins 20 (chuck members, substrate holding unit) as holding members that hold the substrate, a spin base 21, a rotating shaft 22 coupled to a lower surface center of the spin base 21, and an electric motor 23 (substrate rotating unit) applying a rotating force to the rotating shaft 22. The substrate holding unit may also be referred to as a substrate holder.

The rotating shaft 22 extends in a vertical direction along the rotational axis A1 and is a hollow shaft in the present preferred embodiment. The spin base 21 is coupled to an upper end of the rotating shaft 22. The spin base 21 has a disk shape oriented along a horizontal direction. The plurality of chuck pins 20 are disposed at intervals in a circumferential direction at a peripheral edge portion of an upper surface of the spin base 21. The plurality of chuck pins 20 are capable of being opened and closed between a closed state of contacting a peripheral end of the substrate W and gripping the substrate W and an open state of being retracted from the peripheral end of the substrate W. Also in the open state, the plurality of chuck pins 20 are capable of contacting a lower surface of a peripheral edge portion of the substrate W to support the substrate W from below.

A chuck pin driving unit 25 is included to drive the chuck pins 20 to open and close. The chuck pin driving unit 25 includes, for example, a link mechanism 26, incorporated in the spin base 21, and a driving source 27, disposed outside the spin base 21. The driving source 27 includes, for example, a ball screw mechanism and an electric motor that applies a driving force thereto. A specific arrangement example of the chuck pin driving unit 25 is described in Japanese Patent Application Publication No. 2008-034553, etc.

The heater unit 6 is disposed above the spin base 21. An elevating/lowering shaft 30, extending in the vertical direction along the rotational axis A1, is coupled to a lower surface of the heater unit 6. The elevating/lowering shaft 30 is inserted through a penetrating hole 24, formed in a central portion of the spin base 21, and the hollow rotating shaft 22. A lower end of the elevating/lowering shaft 30 extends further lower than a lower end of the rotating shaft 22. The elevating/lowering unit 7 is coupled to the lower end of the elevating/lowering shaft 30. By actuation of the elevating/lowering unit 7, the heater unit 6 is moved vertically between a lower position close to the upper surface of the spin base 21 and an upper position of supporting and lifting the lower surface of the substrate W from the chuck pins 20.

The elevating/lowering unit 7 includes, for example, a ball screw mechanism and an electric motor that applies a driving force thereto. The elevating/lowering unit 7 can thereby position the heater unit 6 at any intermediate position between the lower position and the upper position. For example, in a state of being positioned at a separated position, at which there is a predetermined interval between a heating surface 6a that is an upper surface of the heater unit 6 and the lower surface of the substrate W, the substrate W can be heated by radiant heat from the heating surface 6a. Also, by lifting the substrate W by means of the heater unit 6, the substrate W can be heated with a greater heat amount by heat conduction from the heating surface 6a in a contacting state where the heating surface 6a is put in contact with the lower surface of the substrate W.

The cup 8 includes an exhaust bucket 17 and a multiple guard mechanism 18. The exhaust bucket 17 is arranged to have a circular cylindrical shape and an exhaust duct 171 is coupled to a side surface thereof. The exhaust duct 171 is, for example, connected to exhaust equipment 172 included in a plant in which the substrate processing apparatus 1 is installed. A drain piping 173 is connected to a bottom portion of the exhaust bucket 17. The multiple guard mechanism 18 is housed in an inner side of the exhaust bucket 17 and includes a plurality (three, in the present preferred embodiment) of guards 181, 182, and 183 that are capable of being elevated and lowered independently. The multiple guard mechanism 18 further includes guard elevating/lowering units 184, 185, and 186 that elevate and lower the plurality of guards 181, 182, and 183, respectively. The guard elevating/lowering units 184, 185, and 186 function as guard relative position changing units that respectively move the guards 181, 182, and 183 vertically with respect to the substrate W to change the respective relative positions of the substrate W and the guards 181, 182, and 183. Each of the guard elevating/lowering units 184, 185, and 186 includes, for example, a ball screw mechanism and an electric motor that applies a driving force thereto. The multiple guard mechanism 18 further includes a plurality (two, in the present preferred embodiment) of annular cups 187 and 188 and these are housed in the inner side of the exhaust bucket 17.

The guards 181, 182, and 183 receive processing liquid splashing to a periphery of the substrate W in accompaniment with the rotation of the substrate W. The respective guards 181, 182 and 183 include circular cylindrical portions 191, 192, and 193, which surround the spin chuck 5, and liquid receiving portions 194, 195, and 196, which extend obliquely upward from upper ends toward inner sides approaching the spin chuck 5 of the respective circular cylindrical portions 191, 192, and 193.

The annular cup 188 is disposed so as to surround the spin chuck 5 at an inner side in a rotational radius direction of the substrate W, and further the annular cup 187 is disposed concentric to the annular cup 188 so as to surround the spin chuck 5 at an inner side of the annular cup 188. In the present preferred embodiment, the annular cups 187 and 188 are made integral to the guard 181. Specifically, the annular cup 187 is disposed at an inner side of the guard 181 and the annular cup 188 is disposed at an outer side of the guard 182. However, one of either or both of the annular cups 187 and 188 may be separated from the guard 181. Drain pipings 189 and 190 are connected to bottom portions of the annular cups 187 and 188. The processing liquid received by the guard 181 flows down to the annular cup 187 at the inner side and is expelled through the drain piping 189 coupled to the bottom portion of the annular cup 187. The processing liquid received by the guard 182 flows down to the annular cup 188 at the outer side and is expelled through the drain piping 190 coupled to the bottom portion of the annular cup 188. The processing liquid received by the guard 183 flows down to the bottom portion of the exhaust bucket 17 and is expelled through the drain piping 173.

By actuation of the guard elevating/lowering units 184, 185, and 186, the multiple guard mechanism 18 can take on at least first to fourth states described below.

First state: A state in which the processing liquid from the substrate W is received by the liquid receiving portion 194 of the innermost guard 181 (port 1: see FIG. 2A).

Second state: A state in which the processing liquid from the substrate W is received by the liquid receiving portion 195 of the second guard 182 (port 2: see FIG. 2B).

Third state: A state in which the processing liquid from the substrate W is received by the liquid receiving portion 196 of the outermost guard 183 (port 3: see FIG. 2C).

Fourth state: A state in which the processing liquid from the substrate W is not received by any of the guards (port 0: see FIG. 2D).

Figure 2A:
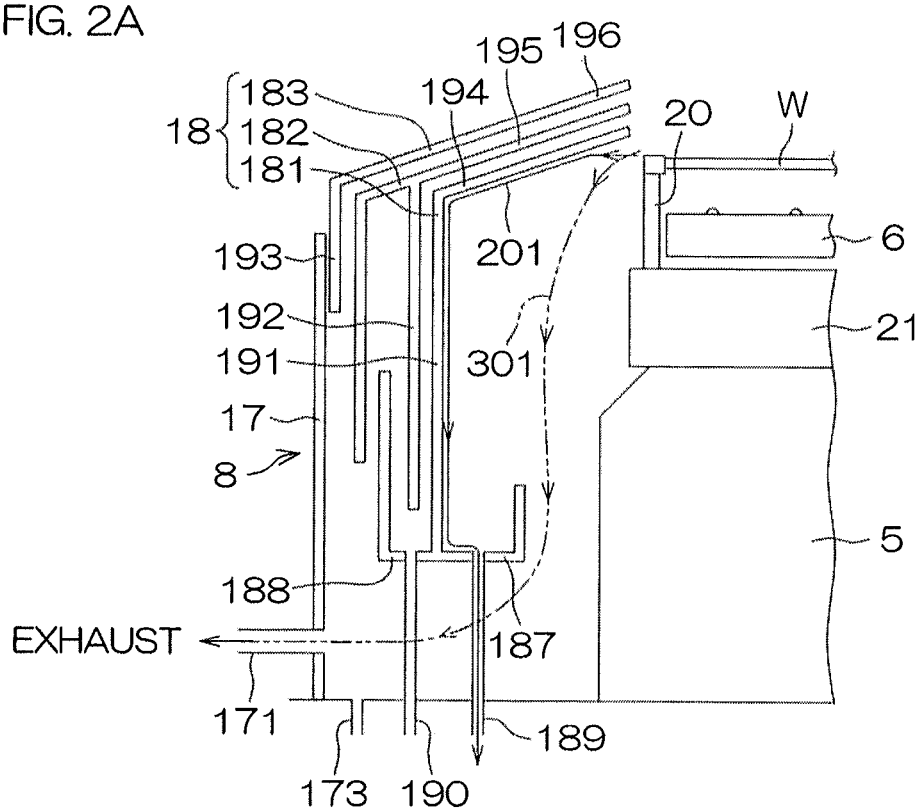
FIG. 2A to FIG. 2D are illustrative sectional views for describing a plurality of states of a multiple guard mechanism included in the processing unit.

In the first state shown in FIG. 2A, a height of the guard 181 is adjusted so that the processing liquid can be received by the liquid receiving portion 194 (port 1) of the guard 181. Heights of the guards 182 and 183 are then adjusted to bring the guards 181 and 182 close together so that a space (port 2) in between these becomes closed and to bring the guards 182 and 183 close together so that a space (port 3) in between these becomes closed. In the first state, the processing liquid splashing to the periphery due to the rotation of the substrate W is received by the guard 181 (port 1), guided to the annular cup 187, and drained from the drain piping 189 along a drain path 201. In this process, an exhaust path 301, passing through a space (port 1) at the inner side of the guard 181 from a vicinity of the substrate W, is formed, and through the exhaust path 301, an atmosphere of a periphery of the substrate W is evacuated and guided to the exhaust duct 171 through the exhaust bucket 17.

Figure 2B:
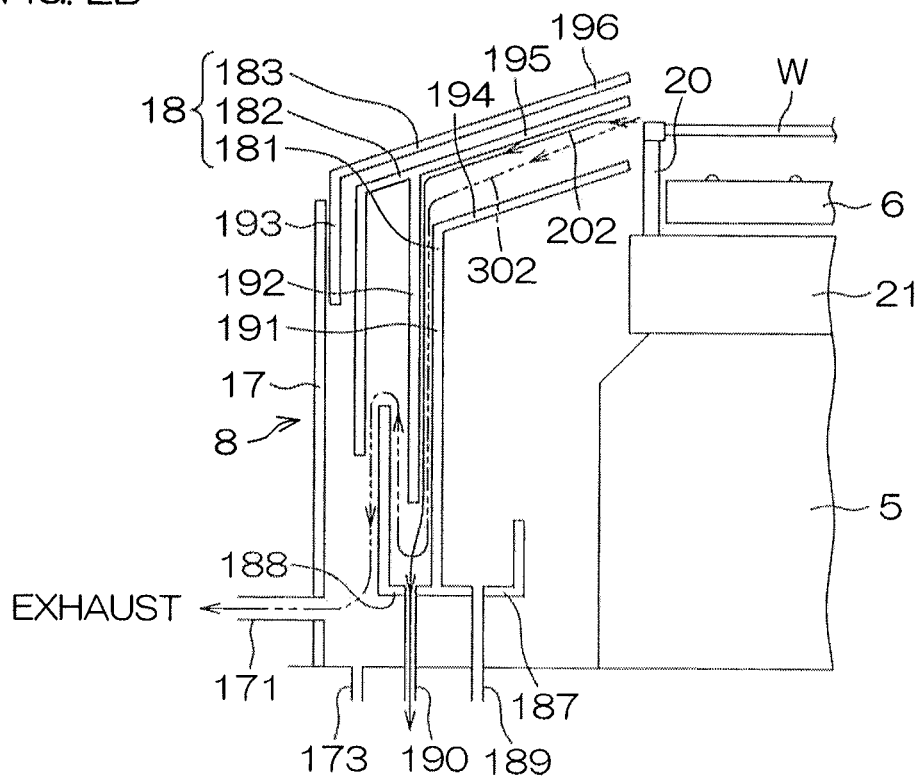

In the second state shown in FIG. 2B, the height of the guard 182 is adjusted so that the processing liquid can be received by the liquid receiving portion 195 of the guard 182. The heights of the guards 181 and 183 are then adjusted to open up an interval between the guards 181 and 182 so that the space (port 2) in between these becomes open and to bring the guards 182 and 183 close together so that the space (port 3) in between these becomes closed. In the second state, the processing liquid splashing to the periphery due to the rotation of the substrate W is received by the guard 182 (port 2), guided to the annular cup 188, and drained from the drain piping 190 along a drain path 202. In this process, an exhaust path 302, passing through the space (port 2) between the guards 181 and 182 from the vicinity of the substrate W, is formed, and through the exhaust path 302, the atmosphere of the periphery of the substrate W is evacuated and the exhaust is guided to the exhaust duct 171 through the exhaust bucket 17.

Figure 2C:
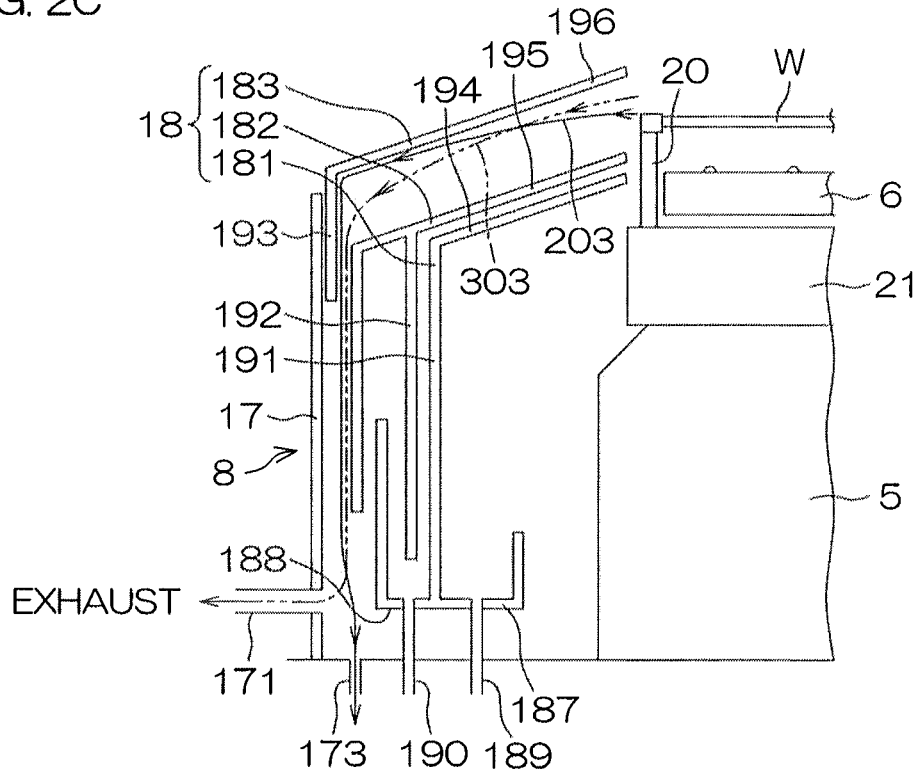

In the third state shown in FIG. 2C, the height of the guard 183 is adjusted so that the processing liquid can be received by the liquid receiving portion 196 of the guard 183. The heights of the guards 181 and 182 are then adjusted to bring the guards 181 and 182 close together so that the space (port 2) in between these becomes closed and to open up an interval between the guards 182 and 183 so that the space (port 3) in between these becomes open. In the third state, the processing liquid splashing to the periphery due to the rotation of the substrate W is received by the guard 183 (port 3), guided to the bottom portion of the exhaust bucket 17, and drained from the drain piping 173 along a drain path 203. In this process, an exhaust path 303, passing through the space (port 3) between the guards 183 and 182 from the vicinity of the substrate W, is formed, and through the exhaust path 303, the atmosphere of the periphery of the substrate W is evacuated and the exhaust is guided through the exhaust bucket 17 to the exhaust duct 171.

Figure 2D:
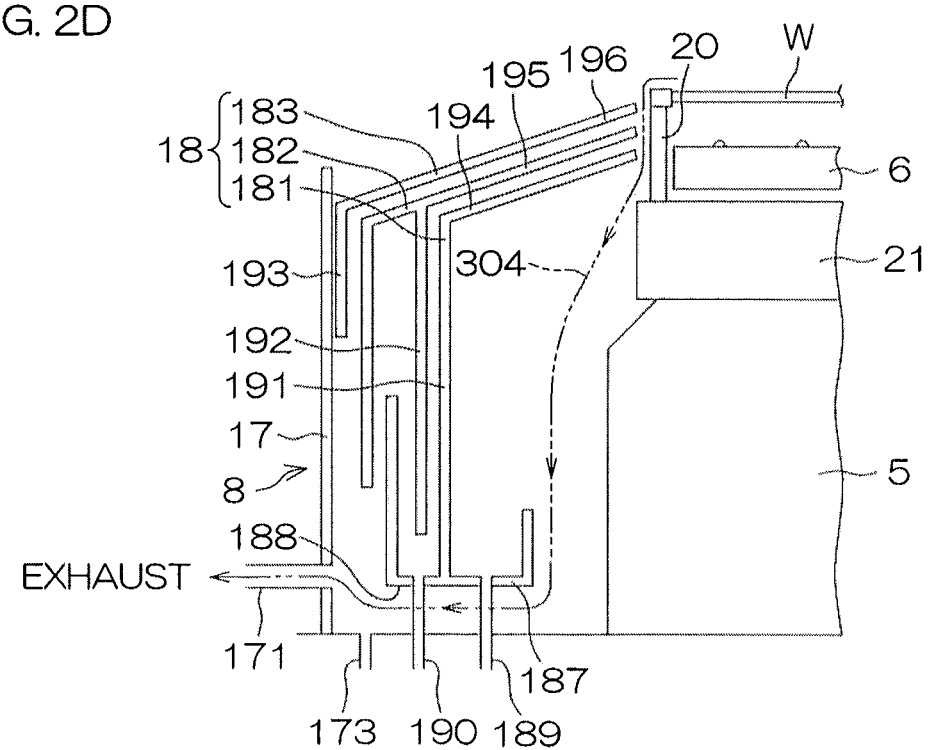

In the fourth state shown in FIG. 2D, all of the liquid receiving portions 194, 195, and 196 of the guards 181, 182, and 183 are set to positions lower than a height of the substrate W and a state (port 0) is entered where none of the guards face a peripheral end surface of the substrate W. The heights of the guards 181, 182, and 183 are then adjusted to bring the guards 181 and 182 close together so that the space (port 2) in between these becomes closed and to bring the guards 182 and 183 close together so that the space (port 3) in between these becomes closed. The fourth state is selected in a state where the rotation of the substrate W is stopped. In the fourth state, the ports 2 and 3 are closed and therefore the atmosphere at the periphery of the substrate W passes through the space (port 1) at the inner side of the guard 181 and guided to the exhaust duct 171 through the exhaust bucket 17 in accordance with an exhaust path 304. The exhaust duct 171 is thus an example of an evacuating unit that evacuates the inner sides of the guards 181, 182, and 183.

With reference to FIG. 2, the first moving nozzle 11 is moved in the horizontal direction and the vertical direction by means of a first nozzle moving unit 15. The first moving nozzle 11 can be moved, by movement in the horizontal direction, between a processing position of facing a rotation center of an upper surface of the substrate W and supplying a processing fluid to the substrate W and a home position (retracted position) of not facing the upper surface of the substrate W. The rotation center of the upper surface of the substrate W is a position of the upper surface of the substrate W that intersects the rotational axis A1. The home position of not facing the upper surface of the substrate W is a position which, in plan view, is at an outer side of the spin base 21 and, more specifically, may be a position at an outer side of the cup 8. By movement in the vertical direction, the first moving nozzle 11 can be brought close to the upper surface of the substrate W or can be retracted upward from the upper surface of the substrate W. The first nozzle moving unit 15 includes, for example, a pivoting shaft 15a oriented along the vertical direction, an arm 15b coupled to the pivoting shaft 15a and extending horizontally, and an arm driving mechanism 15c driving the arm 15b. The arm driving mechanism 15c makes the arm 15b swing by making the pivoting shaft 15a pivot around a vertical pivoting axis and moves the arm 15b vertically by elevating and lowering the pivoting shaft 15a along the vertical direction. The first moving nozzle 11 is fixed to the arm 15b. The first moving nozzle 11 moves in the horizontal direction and a perpendicular direction in accordance with the swinging and elevating/lowering of the arm 15b.

The first nozzle moving unit 15 thus has a function of a nozzle holding unit that holds the first moving nozzle 11 so as to face the upper surface of the substrate W held by the spin chuck 5. Further, the first nozzle moving unit 15 has a function of a distance adjusting unit that adjusts a distance in the vertical direction between the substrate W, held by the spin chuck 5, and the first moving nozzle 11.

The second moving nozzle 12 is moved in the horizontal direction and the perpendicular direction by a second nozzle moving unit 16. The second moving nozzle 12 can be moved, by movement in the horizontal direction, between a position of facing the rotation center of the upper surface of the substrate W and a home position (retracted position) of not facing the upper surface of the substrate W. The home position is a position which, in plan view, is at the outer side of the spin base 21 and, more specifically, may be a position at the outer side of the cup 8. By movement in the vertical direction, the second moving nozzle 12 can be brought close to the upper surface of the substrate W or can be retracted upward from the upper surface of the substrate W. The second nozzle moving unit 16 includes, for example, a pivoting shaft oriented along the vertical direction, an arm (not shown) coupled to the pivoting shaft and extending horizontally, and an arm driving mechanism (not shown) driving the arm. The arm driving mechanism makes the arm swing by making the pivoting shaft pivot around a vertical pivoting axis and moves the arm vertically by elevating and lowering the pivoting shaft along the vertical direction. The second moving nozzle 12 is fixed to the arm. The second moving nozzle 12 moves in the horizontal direction and the perpendicular direction in accordance with the swinging and elevating/lowering of the arm.

In the present preferred embodiment, the first moving nozzle 11 has a function of an organic solvent nozzle that discharges an organic solvent and a function of a gas nozzle that discharges an inert gas, such as nitrogen gas, etc. An organic solvent supply pipe 35 (processing liquid supply pipe) and first to third inert gas supply pipes 36A, 36B, and 36C are coupled to the first moving nozzle 11. The organic solvent supply pipe 35 has interposed therein an organic solvent valve 37 (processing liquid valve) that opens and closes a flow passage thereof. The inert gas supply pipes 36A, 36B, and 36C respectively have interposed therein first to third inert gas valves 38A, 38B, and 38C that open and close respective flow passages thereof. Also, the inert gas supply pipe 36A has interposed therein a mass flow controller 39A (the first adjusting unit) arranged to accurately adjust a flow rate of an inert gas flowing through the flow passage thereof. Also, the inert gas supply pipe 36B has interposed therein a variable flow valve 39B arranged to adjust a flow rate of an inert gas flowing through the flow passage thereof, and the inert gas supply pipe 36C has interposed therein a variable flow valve 39C (the second adjusting unit) arranged to adjust a flow rate of an inert gas flowing through the flow passage thereof. Further, the inert gas supply pipes 36A, 36B, and 36C respectively have interposed therein filters 40A, 40B, and 40C arranged to remove foreign matter.

An organic solvent, such as isopropyl alcohol (IPA), etc., from an organic solvent supply source is supplied to the organic solvent supply pipe 35. Inert gases, such as nitrogen gas (N2), etc., are respectively supplied from inert gas supply sources to the inert gas supply pipes 36A, 36B, and 36C.

In the present preferred embodiment, the second moving nozzle 12 has a function of a chemical liquid nozzle supplying a chemical liquid, such as an acid, alkali, etc. More specifically, the second moving nozzle 12 may have a form of a double-fluid nozzle capable of mixingly discharging a liquid and a gas. The double-fluid nozzle may be used as a straight nozzle when it is made to discharge the liquid with the supply of the gas being stopped. A chemical liquid supply pipe 41 and an inert gas supply pipe 42 are coupled to the second moving nozzle 12. The chemical liquid supply pipe 41 has interposed therein a chemical liquid valve 43 that opens and closes a flow passage thereof. The inert gas supply pipe 42 has interposed therein an inert gas valve 44 that opens and closes a flow passage thereof. A chemical liquid, such as an acid, alkali, etc., from a chemical liquid supply source is supplied to the chemical liquid supply pipe 41. An inert gas, such as nitrogen gas (N2), etc., from an inert gas supply source is supplied to the inert gas supply pipe 42.

An etching liquid and a cleaning liquid are specific examples of the chemical liquid. More specifically, the chemical liquid may be hydrofluoric acid, SC1 (ammonia-hydrogen peroxide mixture), SC2 (hydrochloric acid-hydrogen peroxide mixture), buffered hydrofluoric acid (mixed liquid of hydrofluoric acid and ammonium fluoride), etc.

In the present preferred embodiment, the DIW nozzle 10 is a fixed nozzle disposed to discharge DIW (an example of a fluid) toward the rotation center of the upper surface of the substrate W. DIW from a DIW supply source is supplied via a DIW supply pipe 46 to the DIW nozzle 10. The DIW supply pipe 46 has interposed therein a DIW valve 47 arranged to open and close a flow passage thereof. The DIW nozzle 10 is not required to be a fixed nozzle and may be a moving nozzle that moves at least in the horizontal direction.

The lower surface nozzle 9 is inserted through the hollow supporting shaft 30 and further penetrates through the heater unit 6. The lower surface nozzle 9 has at its upper end, a discharge port 9a facing a lower surface center of the substrate W. A processing fluid from a processing fluid supply source is supplied via a fluid supply pipe 48 to the lower surface nozzle 9. The processing fluid that is supplied may be a liquid or may be a gas. The fluid supply pipe 48 has interposed therein a fluid valve 49 arranged to open and close a flow passage thereof.

Figure 3:
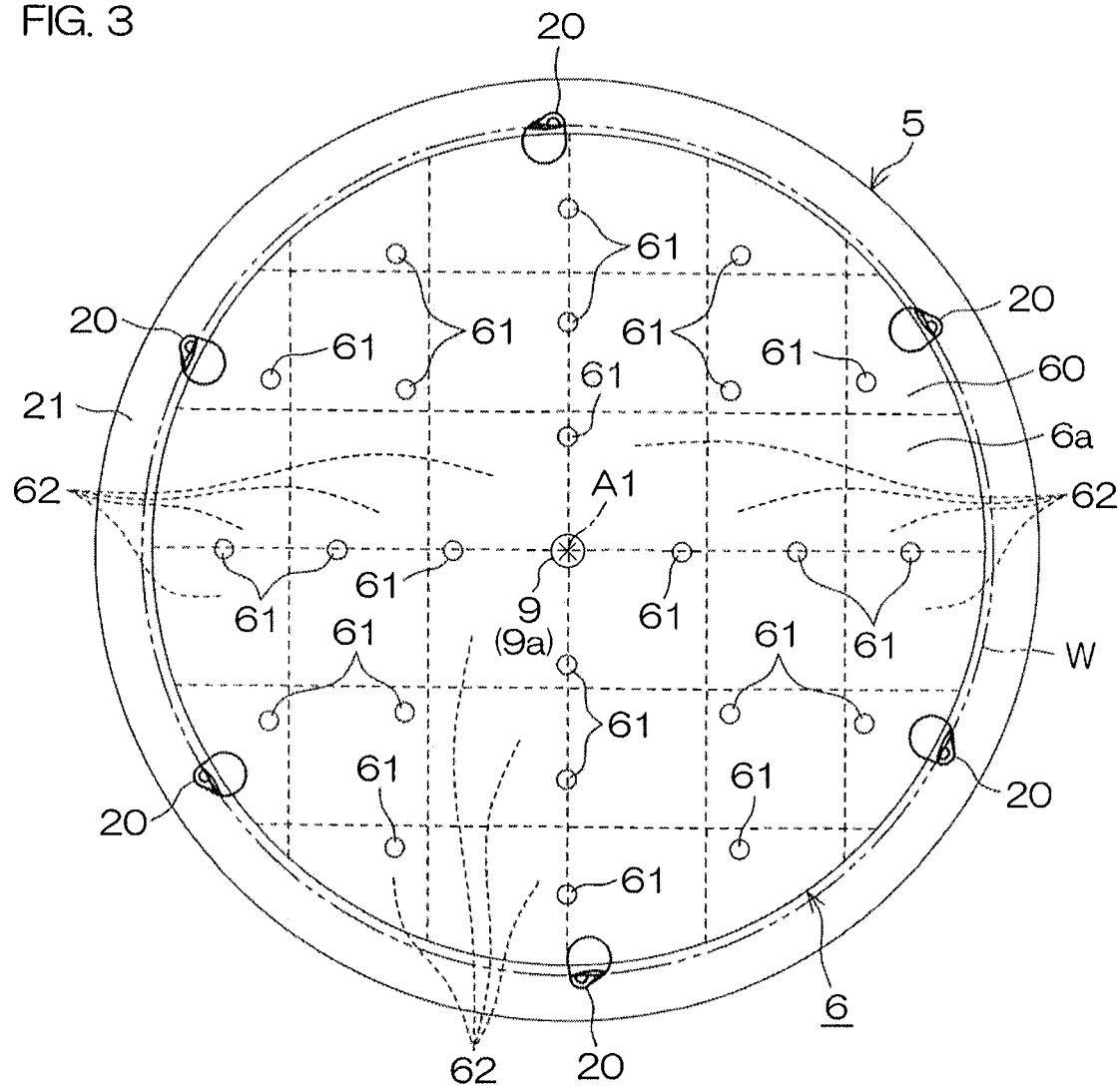
FIG. 3 is a plan view of a spin chuck and a heater unit included in the processing unit.

FIG. 3 is a plan view of the spin chuck 5 and the heater unit 6. The spin base 21 of the spin chuck 5 has, in plan view, a circular shape centered at the rotational axis A1 and a diameter thereof is greater than a diameter of the substrate W. The plurality (six, in the present preferred embodiment) of chuck pins 20 are disposed at intervals at the peripheral edge portion of the spin base 21.

The heater unit 6 has a form of a disk-shaped hot plate and includes a main plate body 60, supporting pins 61, and a heater 62. The main plate body 60 is arranged, in plan view, as a circle centered at the rotational axis A1 and having substantially the same shape and size as the outer shape of the substrate W. More accurately, the main plate body 60 has a circular planar shape with a diameter slightly smaller than the diameter of the substrate W. For example, if the diameter of the substrate W is 300 mm, the diameter of the main plate body 60 (in particular, a diameter of a heating surface 6a) may be 294 mm, that is, only 6 mm smaller. In this case, a radius of the main plate body is 3 mm smaller than a radius of the substrate W.

An upper surface of the main plate body 60 is a flat surface oriented along a horizontal plane. The plurality of supporting pins 61 (see also FIG. 2) project from the upper surface of the main plate body 60. Each supporting pin 61 is, for example, hemispherical and projects by only a minute height (for example, of 0.1 mm) from the upper surface of the main plate body 60. Therefore, when the substrate W is contactingly supported by the supporting pins 61, the lower surface of the substrate W faces the upper surface of the main plate body 60 across a minute interval of, for example, 0.1 mm. The substrate W can thereby be heated efficiently and uniformly.

The upper surface of the main plate body 60 does not have to have the supporting pins 61. If the supporting pins 61 are not provided, the substrate W may be put in contact with the upper surface of the main plate body 60. If the supporting pins 61 are provided, the heating surface 6a of the heater unit 6 includes the upper surface of the main plate body 60 and surfaces of the supporting pins 61. Also, if the supporting pins 61 are not provided, the upper surface of the main plate body 60 corresponds to being the heating surface 6a. In the description that follows, a state where the supporting pins 61 are in contact with the lower surface of the substrate W may be referred to as the heating surface 6a being in contact with the lower surface of the substrate W, etc.

The heater 62 may be a resistor body incorporated in the main plate body 60. FIG. 3 shows a heater 62 that is partitioned into a plurality of regions. By energizing the heater 62, the heating surface 6a is heated to a temperature higher than room temperature (for example, 20 to 30° C., for example 25° C.). Specifically, by energizing the heater 62, the heating surface 6a can be heated to a temperature that is higher than a boiling point of the organic solvent supplied from the first moving nozzle 11. As shown in FIG. 2, a feeder 63 to the heater 62 is passed inside the supporting shaft 30. A heater energization unit 64, which supplies electric power to the heater 62, is connected to the feeder 63. The heater energization unit 64 may be energized constantly during operation of the substrate processing apparatus 1.

The supporting pins 61 are disposed substantially uniformly on the upper surface of the main plate body 60. The chuck pins 20 are disposed further to the outer side than an outer peripheral end of the main plate body 60. The entirety of each chuck pin 20 does not have to be disposed further to the outer side than the outer peripheral end of the main plate body 60 and it suffices that a portion facing a vertical movement range of the heater unit 6 be positioned further to the outer side than the outer peripheral end of the main plate body 60.

Figure 4:
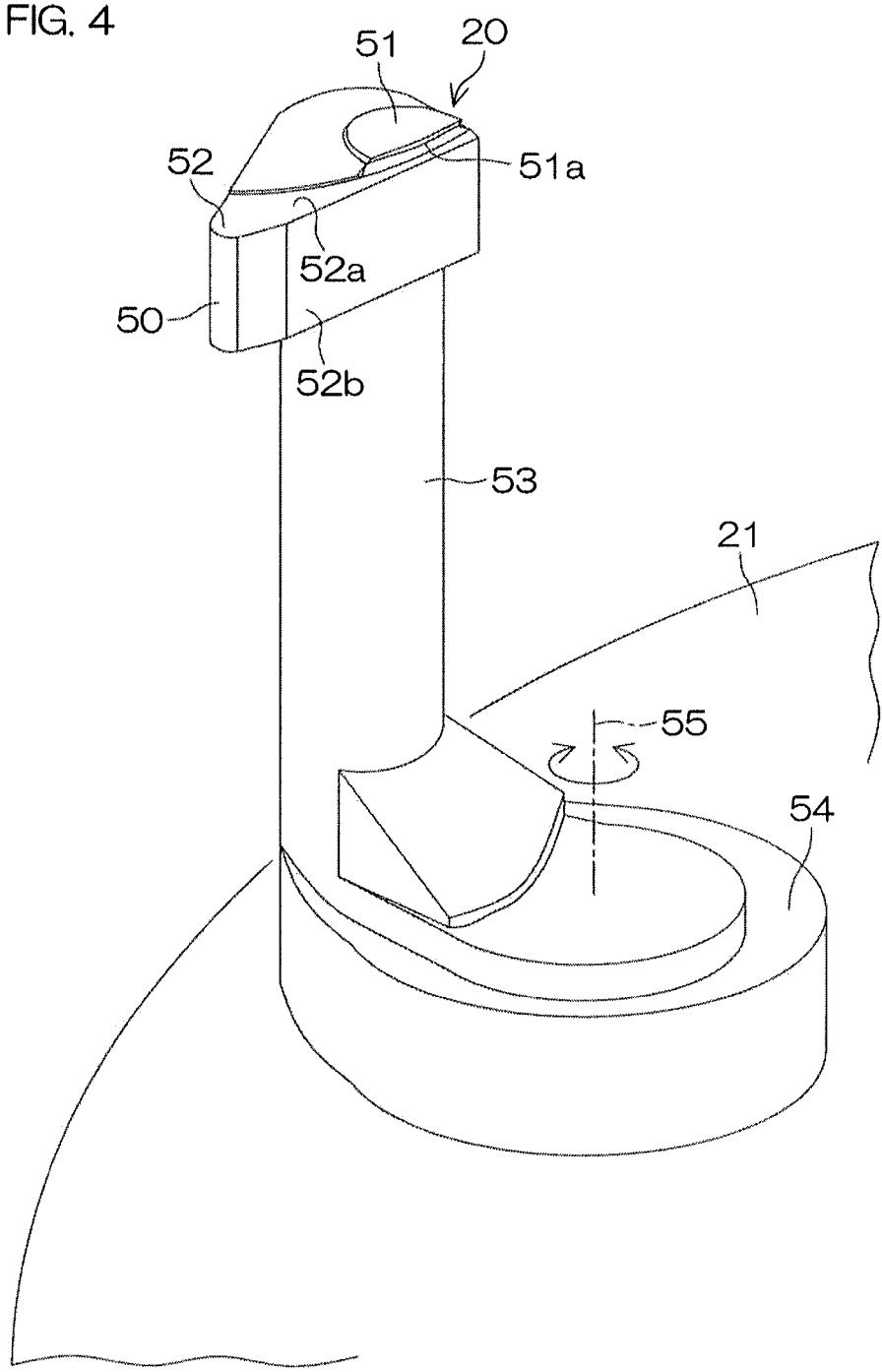
FIG. 4 is a perspective view for describing a structural example of a chuck pin included in the spin chuck.
Figure 5A:
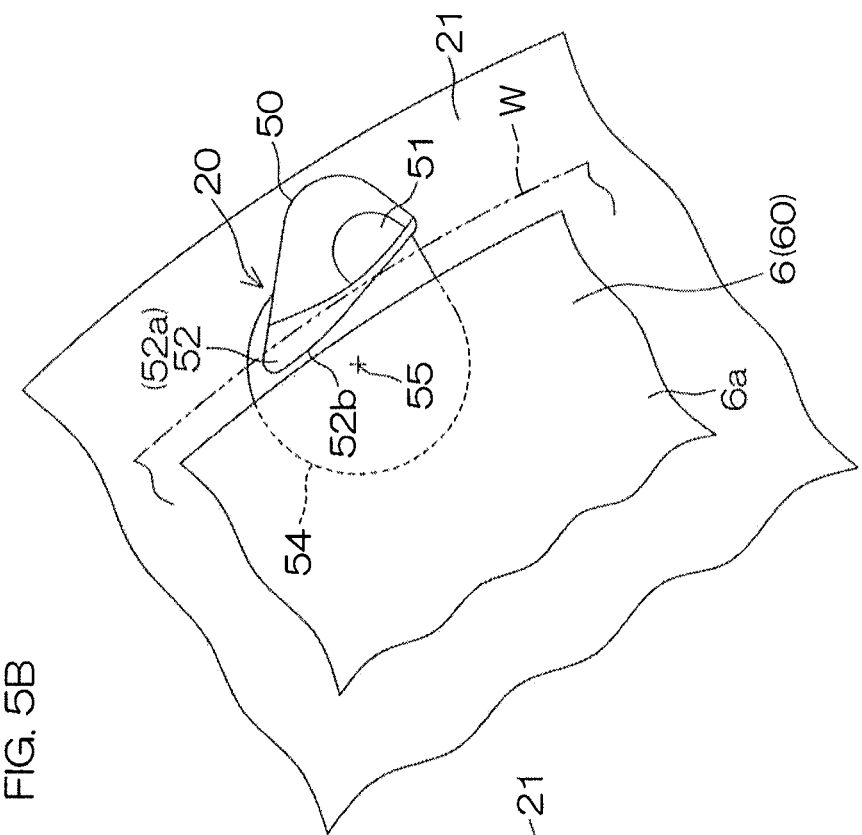
FIG. 5A and FIG. 5B are plan views of the chuck pin, with FIG. 5A showing a closed state and FIG. 5B showing an open state.
Figure 5B:
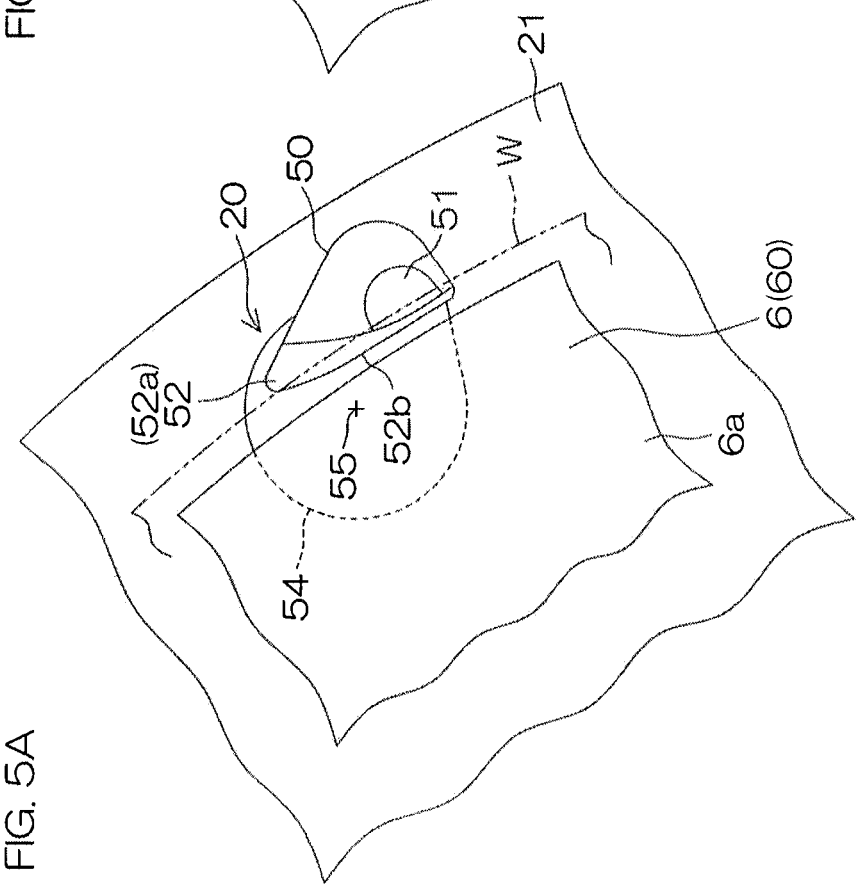

FIG. 4 is a perspective view for describing a structural example of a chuck pin 20. FIGS. 5A and 5B are plan views of the chuck pin 20 with FIG. 5A showing a closed state and FIG. 5B showing an open state.

The chuck pin 20 includes a shaft portion 53 extending in the vertical direction, a base portion 50 provided at an upper end of the shaft portion 53, and a pivoting supporting portion 54 provided at a lower end of the shaft portion 53. The base portion 50 includes a gripping portion 51 and a supporting portion 52. The pivoting supporting portion 54 is coupled to the spin base 21 in a manner enabling pivoting around a chuck pivoting axis 55 oriented along the vertical direction. The shaft portion 53 is coupled to the pivoting supporting portion 54 while being offset at a position separated from the chuck pivoting axis 55. More specifically, the shaft portion 53 is disposed at a position further separated from the rotational axis A1 than the chuck pivoting axis 55. Therefore, when the chuck pin 20 is pivoted around the chuck pivoting axis 55, the base portion 50 pivots around the chuck pivoting axis 55 while its entirety moves along the peripheral end surface of the substrate W. The pivoting supporting portion 54 is coupled to the link mechanism 26 (see FIG. 2) provided in the interior of the spin base 21. By a driving force from the link mechanism 26, the pivoting supporting portion 54 is pivoted reciprocally within a predetermined angular range around the chuck pivoting axis 55.

The base portion 50 is formed to a wedge shape in plan view. A supporting surface 52a, which contacts the peripheral edge portion lower surface of the substrate W to support the substrate W from below when the chuck pin 20 is in the open state, is provided on an upper surface of the base portion 50. In other words, the base portion 50 has the supporting portion 52 having the supporting surface 52a as an upper surface. On the upper surface of the base portion 50, the gripping portion 51 projects upward at a position separate from the supporting portion 52. The gripping portion 51 has a holding groove 51a opening in a V-shape so as to face the peripheral end surface of the substrate W.

When the pivoting supporting portion 54 is pivoted in a clockwise direction around the chuck pivoting axis 55 from the open state shown in FIG. 5B, the gripping portion 51 approaches the peripheral end surface of the substrate W and the supporting portion 52 separates from the rotation center of the substrate W. Also, when the pivoting supporting portion 54 is pivoted in a counterclockwise direction around the chuck pivoting axis 55 from the closed state shown in FIG. 5A, the gripping portion 51 separates from the peripheral end surface of the substrate W and the supporting portion 52 approaches the rotation center of the substrate W.

In the closed state of the chuck pin 20 shown in FIG. 5A, the peripheral end surface of the substrate W enters into the holding groove 51a. In this state, the lower surface of the substrate W is positioned at a height separated upward by only a minute distance from the supporting surface 52a. In the open state of the chuck pin 20 shown in FIG. 5B, the peripheral end surface of the substrate W is removed from the holding groove 51a and, in plan view, the gripping portion 51 is positioned further to the outer side than the peripheral end surface of the substrate W. In both the open state and the closed state of the chuck pin 20, the supporting surface 52a is at least partially positioned below the peripheral edge portion lower surface of the substrate W.

When the chuck pin 20 is in the open state, the substrate W can be supported by the supporting portion 52. When the chuck pin 20 is switched from the open state to the closed state, the peripheral end surface of the substrate W is guided into the holding groove 51a of V-shaped cross section while being guided by and rising against the holding groove 51a and a state is entered where the substrate W is clamped by the upper and lower inclined surfaces of the holding groove 51a. When the chuck pin 20 is switched from that state to the open state, the peripheral end surface of the substrate W slips downward while being guided by the lower inclined surface of the holding groove 51a and the peripheral edge portion lower surface of the substrate W contacts the supporting surface 52a.

As shown in FIG. 5A and FIG. 5B, an edge portion of the base portion 50 that faces the main plate body 60 of the heater unit 6 in plan view follows the shape of the peripheral edge of the main plate body 60. That is, the supporting portion 52 has a side surface 52B, which, in plan view, is positioned further to the outer side than the main plate body 60 with respect to the rotation center. The main plate body 60 having the heating surface 6a of circular shape slightly smaller than the substrate W thus does not interfere with the chuck pins 20 when the heater unit 6 moves vertically. The non-interfering positional relationship is maintained in both the closed state and the open state of the chuck pins 20. That is, in both the closed state and the open state of the chuck pins 20, the side surface 52b of each supporting portion 52 is separated toward the outer side from the heating surface 6a of the heater unit 6. Thus regardless of whether the chuck pins 20 are in the closed state or the open state, the heater unit 6 can be elevated or lowered while letting the heating surface 6a pass along the inside of the side surfaces 52b.

The diameter of the substrate W is, for example, 300 mm and the diameter of the upper surface of the main plate body 60 is, for example, 294 mm. Therefore, the heating surface 6a faces substantially the entirety of the lower surface of the substrate W, including a central region and a peripheral edge region. In both the closed state and the open state of the chuck pins 20, the supporting portions 52 are disposed in a state where an interval not less than a predetermined minute interval (for example, of 2 mm) is secured outside the outer peripheral edge of the heating surface 6a.

The gripping portion 51 is arranged so that, in the closed state of the corresponding chuck pin 20, an inner edge thereof is positioned in a state of securing an interval not less than a predetermined minute interval (for example, of 2 mm) outside the outer peripheral edge of the main plate body 60. Therefore with the heater unit 6, in both the closed state and the open state of the chuck pins 20, the heating surface 6a can be moved vertically at the inner side of the gripping portions 51 and be elevated until contacted with the lower surface of the substrate W.

The chuck pivoting axis 55 are positioned, in plan view, along a circumference centered at the rotation axis A1 (see FIG. 2 and FIG. 3) and having a smaller radius than the radius of the heating surface 6a.

Figure 6A:
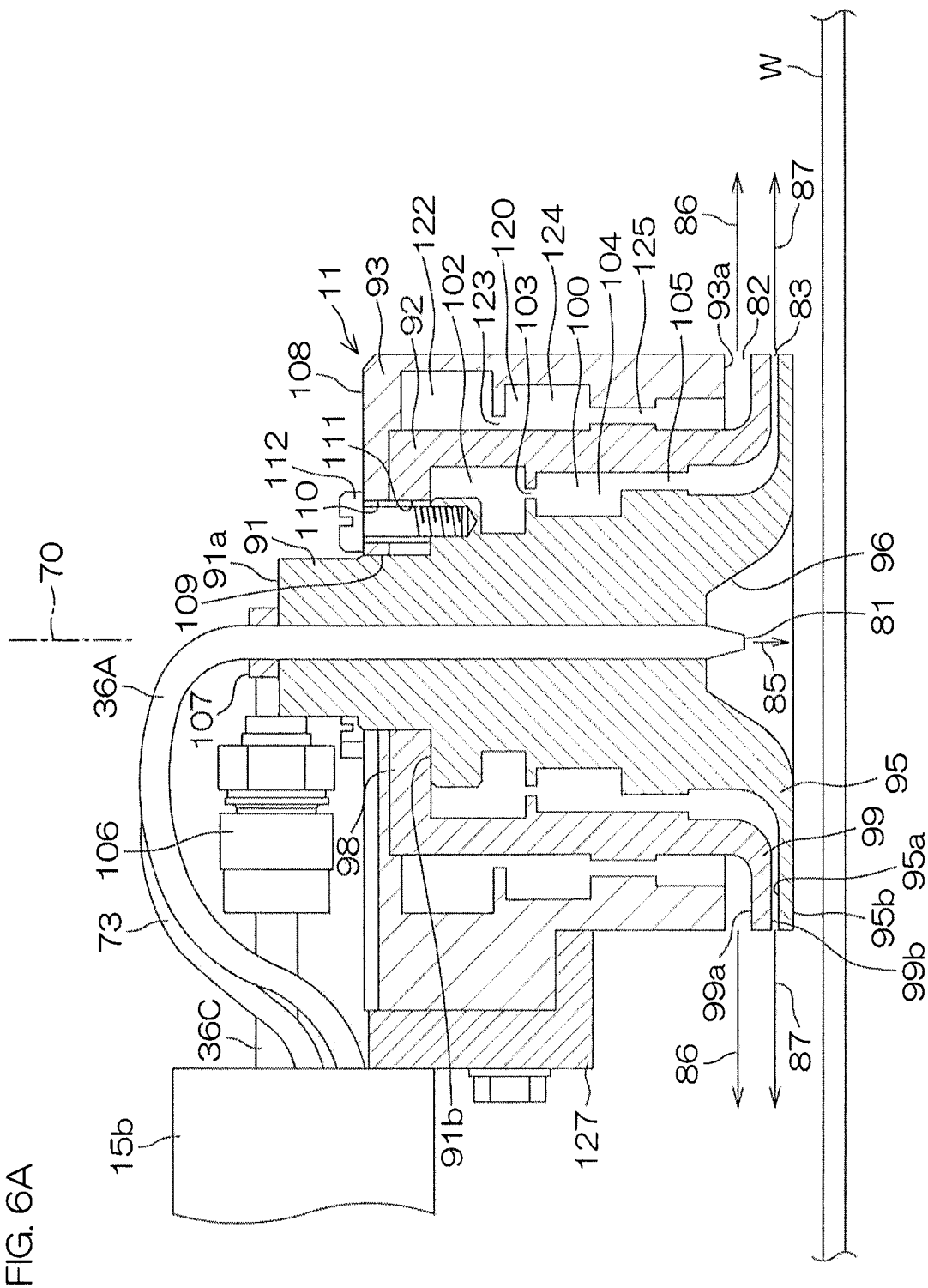
FIG. 6A is a vertical sectional view for describing an arrangement example of a first moving nozzle included in the processing unit.
Figure 6B:
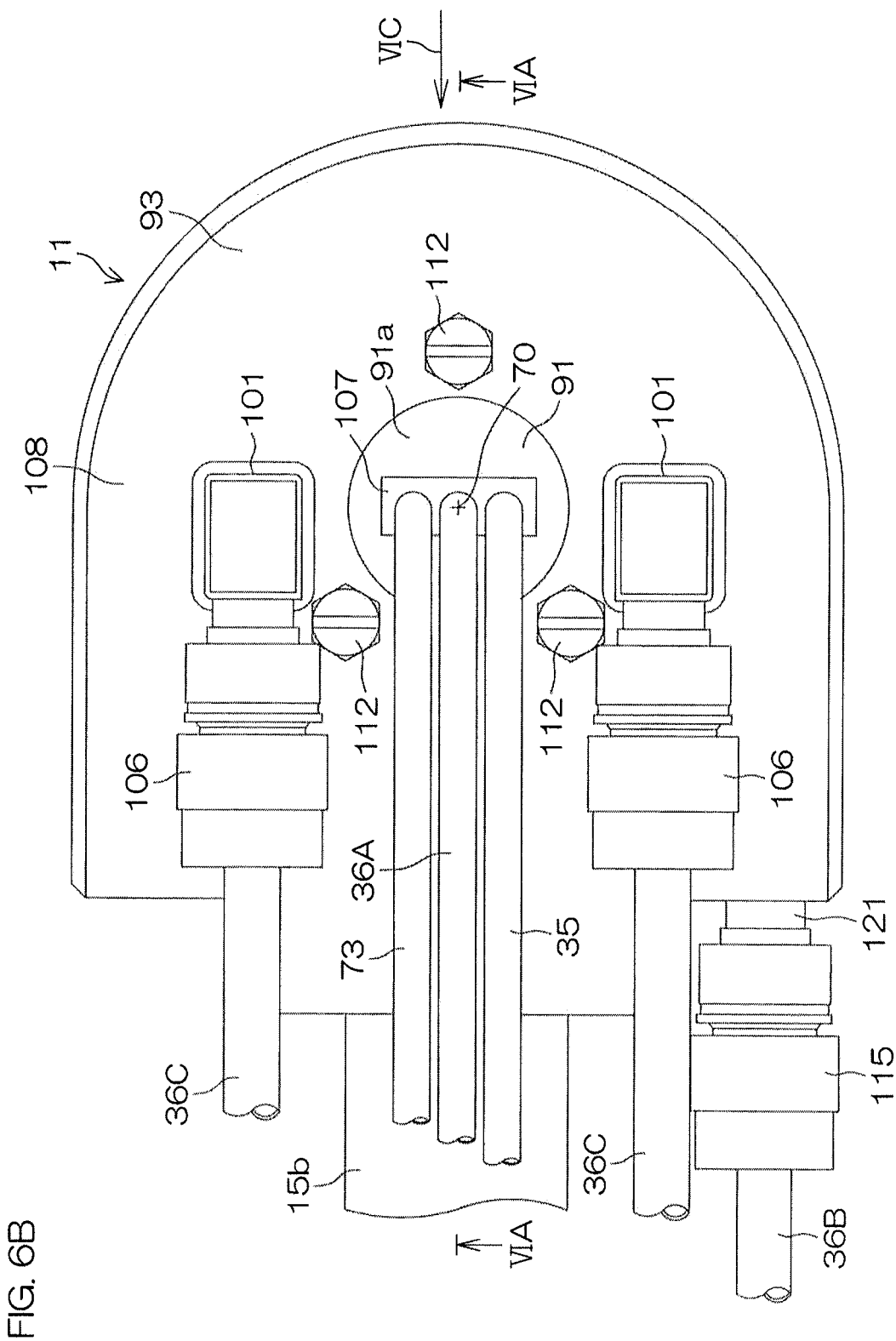
FIG. 6B is a plan view of the arrangement example of the first moving nozzle.
Figure 6C:
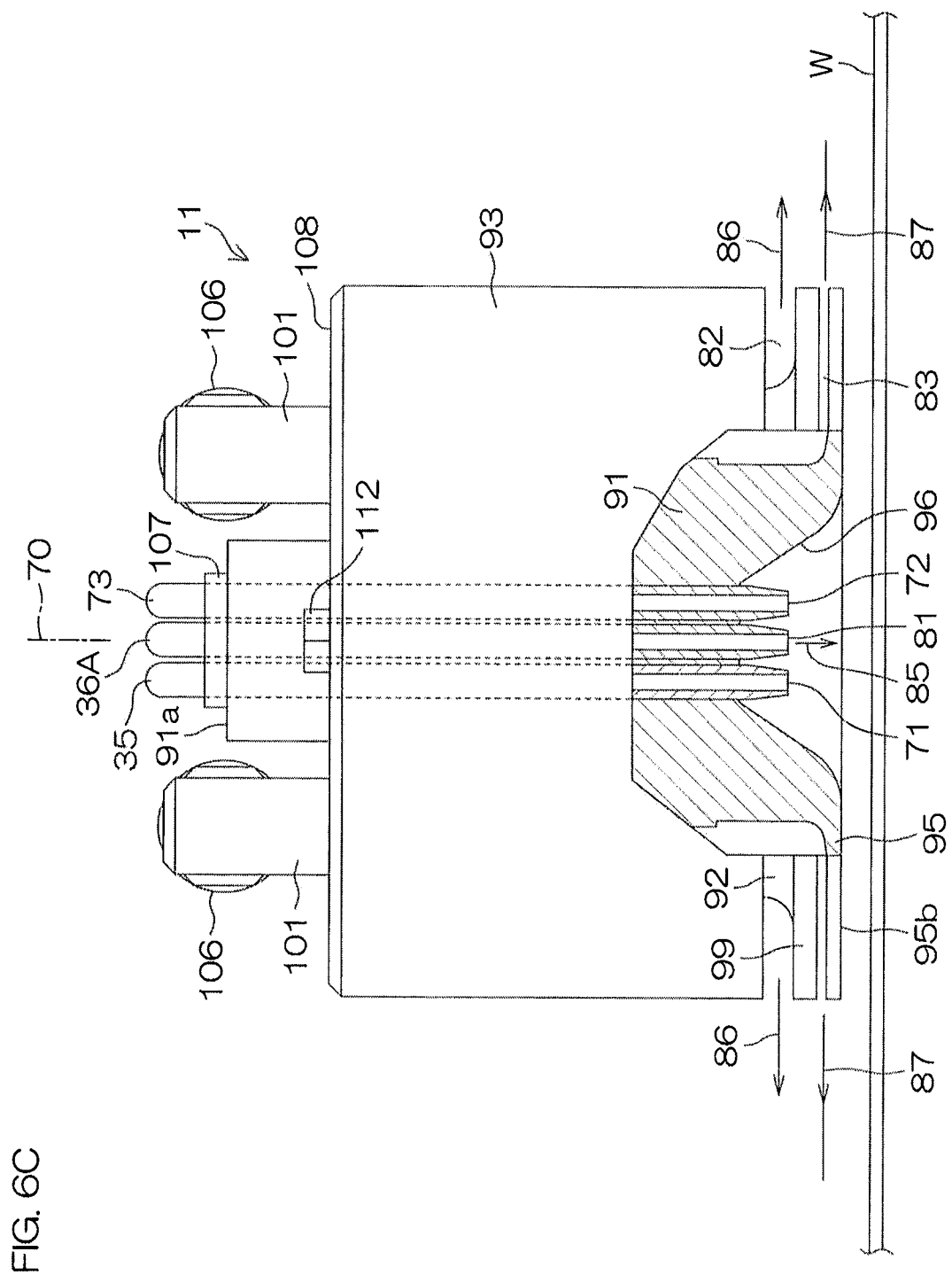
FIG. 6C is a partially cutaway side view of the arrangement example of the first moving nozzle.
Figure 6D:
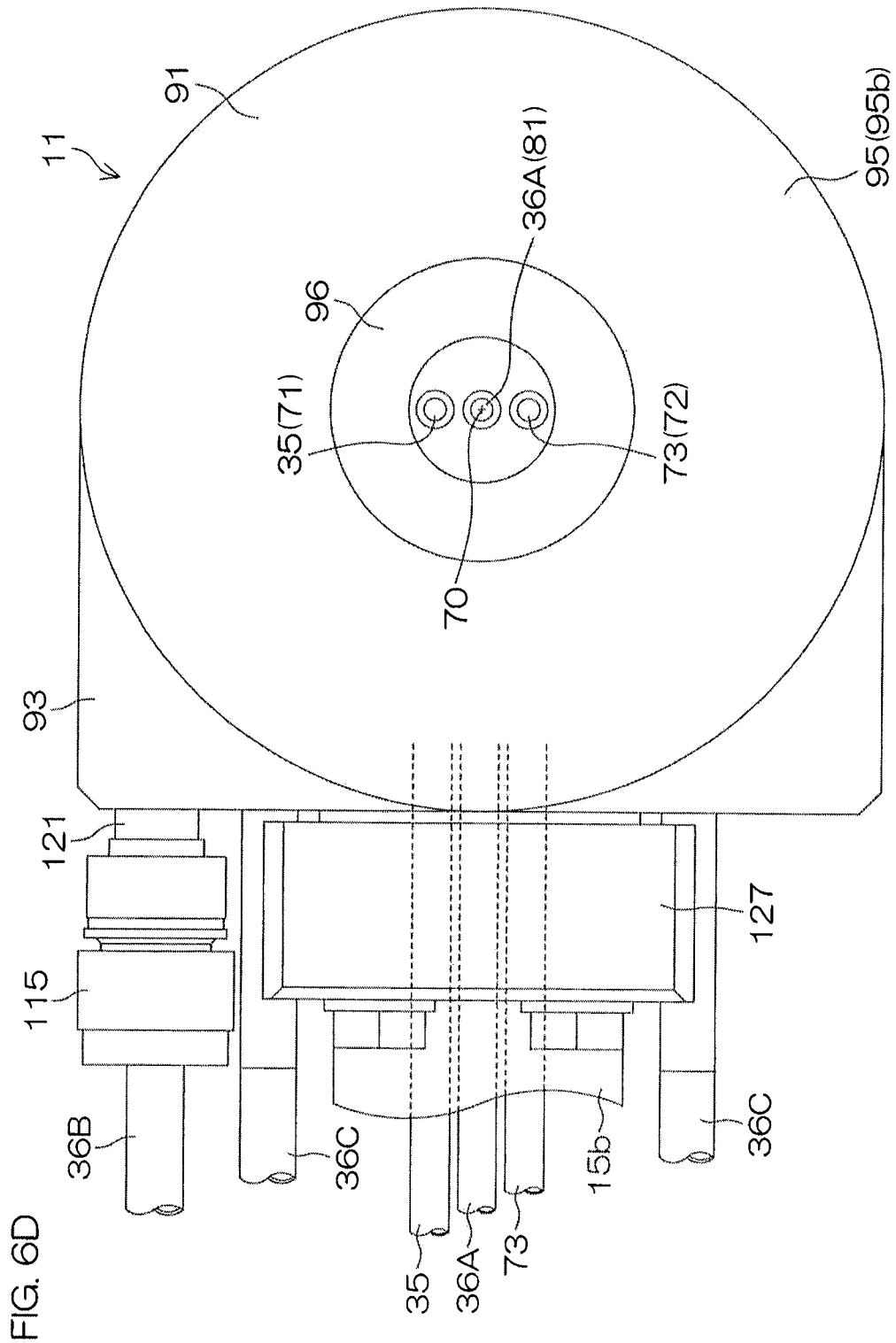
FIG. 6D is a bottom view of the arrangement example of the first moving nozzle.

FIG. 6A is a vertical sectional view (sectional view taken along VIA-VIA of FIG. 6B) for describing an arrangement example of the first moving nozzle 11. Also, FIG. 6B is a plan view thereof, FIG. 6C is a side view thereof, and FIG. 6D is a bottom view thereof. In FIG. 6C, the arrangement viewed in the direction of an arrow VIC in FIG. 6B is shown in a partially cutaway manner.

The first moving nozzle 11 is a fluid nozzle having a plurality of discharge ports. The first moving nozzle 11 has a linear stream discharge port 81 that discharges a fluid (an inert gas in the present preferred embodiment) in a straight line perpendicular to the upper side major surface of the substrate W along a central axis 70 disposed perpendicular to the upper side major surface of the substrate W. Further, the first moving nozzle 11 has a first parallel stream discharge port 82 radially discharging a fluid (an inert gas in the present preferred embodiment) to a periphery of the central axis 70 along a plane perpendicular to the central axis 70. Also, the first moving nozzle 11 has, below the first parallel stream discharge port 82, a second parallel stream discharge port 83 radially discharging a fluid (an inert gas in the present preferred embodiment) to a periphery of the central axis 70 along a plane perpendicular to the central axis 70. The inert gas discharged from the linear stream discharge port 81 forms a linear gas stream 85 that is perpendicularly incident on the upper side major surface of the substrate W. The inert gas discharged from the first parallel stream discharge port 82 forms a first parallel gas stream 86 parallel to the upper surface of the substrate W and covering the upper surface of the substrate W. The inert gas discharged from the second parallel stream discharge port 83 forms, below the first parallel gas stream 86, a second parallel gas stream 87 parallel to the upper surface of the substrate W and covering the upper surface of the substrate W. The first and second parallel gas streams 86 and 87 merge to form a laminar stream that flows along the upper surface of the substrate W. The inert gas discharged from the linear stream discharge port 81 collides against the upper surface of the substrate W and thereafter forms a gas stream flowing radially along the upper surface of the substrate W. This gas stream also constitutes a portion of the laminar flow.

As shown most clearly in FIG. 6A, the first moving nozzle 11 includes an inner constituent member 91, an intermediate constituent member 92 disposed outside the member 91, and an outer constituent member 93 disposed outside the member 92.

The inner constituent member 91 is arranged to a substantially circular columnar shape and has an outward flange portion 95 at its lower end portion. The flange portion 95 has an upper surface 95a perpendicular to the central axis 70 (that is, parallel to the upper surface of the substrate W). Also, the flange portion 95 has a bottom portion 95b perpendicular to the central axis 70 (that is, parallel to the upper surface of the substrate W). At an inner side of the flange portion 95, a recess 96, which is recessed in a direction away from the upper surface of the substrate W, is formed in a lower end surface of the inner constituent member 91. The recess 96 is formed to a substantially truncated conical shape that is rotationally symmetrical around the central axis 70.

Three pipes 36A, 35, and 73 are passed parallel to the central axis 70 through a central portion of the inner constituent member 91 from the upper surface 91a to the recess 96. Specifically, the inert gas supply pipe 36A, the organic solvent supply pipe 35, and a chemical liquid supply pipe 73 (omitted from illustration in FIG. 2) are passed through. Lower end portions of the supply pipes 36A, 35, and 73 are disposed inside the recess 96. The lower end portion of the inert gas supply pipe 36A constitutes the linear stream discharge port 81. The lower end portion of the organic solvent supply pipe 35 constitutes a central discharge port 71 discharging a fluid (in the present preferred embodiment, an organic solvent as an example of a processing liquid) toward the upper surface of the substrate W in a vicinity of the central axis 70. The lower end portion of the chemical liquid supply pipe 73 constitutes a chemical liquid discharge port 72 discharging a fluid (in the present preferred embodiment, a chemical liquid as an example of a processing liquid) toward the upper surface of the substrate W in the vicinity of the central axis 70.

The inert gas supply pipe 36A provides a fluid passage (first fluid passage) having a vicinity of an upper end of the inner constituent member 91 as a fluid inlet (first fluid inlet) and putting the fluid inlet and the linear stream discharge port 81 in communication. Similarly, the organic solvent supply pipe 35 provides a fluid passage (fifth fluid passage) having a vicinity of the upper end of the inner constituent member 91 as a fluid inlet (fifth fluid inlet) and putting the fluid inlet and the central discharge port 71 in communication. The chemical liquid supply pipe 73 provides a fluid passage having a vicinity of the upper end of the inner constituent member 91 as a fluid inlet and putting the fluid inlet and the chemical liquid discharge port 72 in communication.

On an outer peripheral surface of the inner constituent member 91, a shoulder portion 91b is formed to an annular shape that is rotationally symmetrical around the central axis 70. The intermediate constituent member 92 is engaged with the shoulder portion 91b. More specifically, the intermediate constituent member 92 is formed to a circular cylindrical shape and has an inward flange portion 98 formed at its upper end. The flange portion 98 engages with the shoulder portion 91b. Also, an outward flange portion 99 is formed at a lower end portion of the intermediate constituent member 92. The flange portion 99 has an upper surface 99a perpendicular to the central axis 70 (that is, parallel to the upper surface of the substrate W). Also, the flange portion 99 has a bottom surface 99b perpendicular to the central axis 70 (that is, parallel to the upper surface of the substrate W). The bottom surface 99b faces the upper surface 95a of the flange portion 95 formed at the lower end portion of the inner constituent member 91. The second parallel stream discharge port 83, which is perpendicular to the central axis 70, is thereby defined between the bottom surface 99b and the upper surface 95a.

A fluid passage 100 (third fluid passage) is defined to have a cylindrical shape between the outer peripheral surface of the inner constituent member 91 and an inner peripheral surface of the intermediate constituent member 92. The fluid passage 100 communicates with a fluid inlet 101 (third fluid inlet; see FIG. 6B and FIG. 6C), coupled to the inert gas supply pipe 36C, and with the second parallel stream discharge port 83 and thereby puts these in communication. Projections and recesses are formed on the outer peripheral surface of the inner constituent member 91 and the inner peripheral surface of the intermediate constituent member 92, and a first buffer portion 102, a first constricted passage 103, a second buffer portion 104, and a second constricted passage 105 are thereby formed in the fluid passage 100. The inert gas from the fluid inlet 101 is introduced into the first buffer portion 102, where it stays and thus diffuses in a circumferential direction, and then further passes through the first constricted passage 103 and is then introduced into the second buffer portion 104, where it stays and thus diffuses in the circumferential direction again. The inert gas inside the second buffer portion 104 then passes through the second constricted passage 105 and reaches the second parallel stream discharge port 83. By the inert gas being made uniform in pressure in the first and second buffer portions 102 and 104, the second parallel stream discharge port 83 can blow out the inert gas radially at a flow rate and flow speed that are uniform throughout its entire perimeter.

The intermediate constituent member 92 is covered from its upper surface side by the outer constituent member 93. The outer constituent member 93 has a top surface portion 108 that is orthogonal to the central axis 70. A lower surface of the top surface portion 108 is supported by an upper end surface of the intermediate constituent member 92. A penetrating hole 109, allowing the inner constituent member 91 to penetrate through upward, is formed in the top surface portion 108. The outer constituent member 93 is coupled to the inner constituent member 91 by a bolt 112 that is inserted from the upper side of the top surface portion 108 and through an insertion hole 110, formed in the top surface portion 108, and an insertion hole 111, formed in the flange portion 98 of the intermediate constituent member 92, and is engaged with the inner constituent member 91. At the same time, the intermediate constituent member 92 is thereby clamped by the inner constituent member 91 and the outer constituent member 93, and the inner constituent member 91, the intermediate constituent member 92, and the outer constituent member 93 are thereby coupled integrally.

A space with a substantially circular cylindrical shape that is rotationally symmetrical with respect to the central axis 70 is formed at an inner side of the outer constituent member 93. The intermediate constituent member 92 is housed inside the space. A bottom surface 93a of the outer constituent member 93 is oriented along a plane perpendicular to the central axis 70 (that is, parallel to the upper surface of the substrate W) and faces the upper surface 99a of the flange portion 99 of the intermediate constituent member 92. The first parallel stream discharge port 82, which is perpendicular to the central axis 70 (that is, parallel to the upper surface of the substrate W), is thereby defined between the bottom surface 93b and the upper surface 99a.

A fluid passage 120 (second fluid passage) is defined to have a cylindrical shape between an outer peripheral surface of the intermediate constituent member 92 and an inner peripheral surface of the outer constituent member 93. The fluid passage 120 communicates with a fluid inlet 121 (second fluid inlet; see FIG. 6B and FIG. 6D), coupled to the inert gas supply pipe 36B, and with the first parallel stream discharge port 82 and thereby puts these in communication. Projections and recesses are formed on the outer peripheral surface of the intermediate constituent member 92 and the inner peripheral surface of the outer constituent member 93 (mainly on the inner peripheral surface of the outer constituent member 93 in the present preferred embodiment), and a first buffer portion 122, a first constricted passage 123, a second buffer portion 124, and a second constricted passage 125 are thereby formed in the fluid passage 120. The inert gas from the fluid inlet 121 is introduced into the first buffer portion 122, where it stays and thus diffuses in the circumferential direction, and then further passes through the first constricted passage 123 and is then introduced into the second buffer portion 124, where it stays and thus diffuses in the circumferential direction again. The inert gas in the second buffer portion 124 then passes through the second constricted passage 125 and reaches the first parallel stream discharge port 82. By the inert gas being made uniform in pressure in the first and second buffer portions 122 and 124, the first parallel stream discharge port 82 can blow out the inert gas radially at a flow rate and flow speed that are uniform throughout its entire perimeter.

The outer constituent member 93 is coupled via a bracket 127 to the arm 15b of the first nozzle moving unit 15.

A pair of the fluid inlets 101 are disposed at the top surface portion 108 of the outer constituent member 93. The pair of fluid inlets 101 are disposed at positions facing each other across the central axis 70 in plan view. A pair of the inert gas supply pipes 36C are coupled via pipe joints 106 to the pair of fluid inlets 101. The inert gas is thereby introduced into the cylindrical flow passage 100 from two locations at a 180-degree angular interval centered at the central axis 70.

An upper portion of the inner constituent member 91 projects above the outer constituent member 93 and, from an upper surface 91a thereof, the inert gas supply pipe 36A, the organic solvent supply pipe 35, and the chemical liquid supply pipe 73 are inserted along the central axis 70. A pipe holding member 107 holding the supply pipes 36A, 35, and 40 is disposed on the upper surface of the inner constituent member 91.

The fluid inlet 121 is disposed at a side surface of the outer constituent member 93. The inert gas supply pipe 36B is coupled via a pipe joint 115 to the fluid inlet 121. The inert gas from the inert gas supply pipe 36B can thereby be introduced into the fluid passage 120 via the fluid inlet 121.

Figure 7:
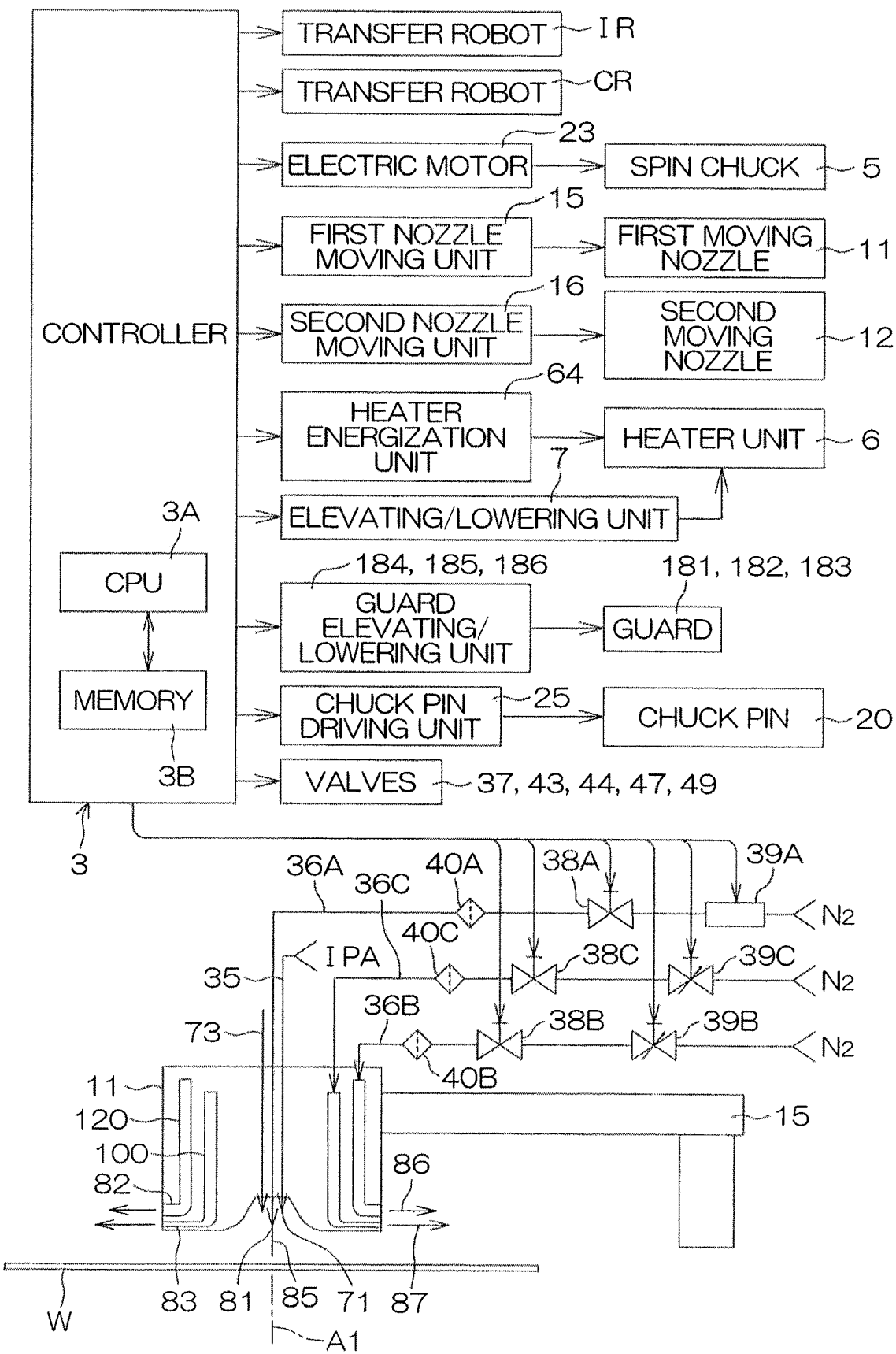
FIG. 7 is a block diagram for describing the electrical arrangement of a main portion of the substrate processing apparatus.

FIG. 7 is a block diagram for describing the electrical arrangement of a main portion of the substrate processing apparatus 1. The controller 3 includes a microcomputer and controls control objects included in the substrate processing apparatus 1 in accordance with a predetermined control program. More specifically, the controller 3 includes a processor (CPU) 3A and a memory 3B, storing the control program, and is configured so that various controls for substrate processing are executed by the processor 3A executing the control program. In particular, the controller 3 controls operations of the transfer robots IR and CR, the electric motor 23 that performs rotational drive of the spin chuck 5, the first nozzle moving unit 15, the second nozzle moving unit 16, the heater energization unit 64, the elevating/lowering unit 7 that elevates and lowers the heater unit 6, the chuck pin driving unit 25, the valves 37, 43, 44, 47, and 49, etc. The controller 3 also controls operations of the guard elevating/lowering units 184, 185, and 186 that elevate and lower the guards 181, 182, and 183. The controller 3 further performs opening and closing control of the first to third inert gas valves 38A, 38B, and 38C. The controller 3 further controls an opening degree of the mass flow controller 39A to control the flow rate of the inert gas passing through the inert gas supply pipe 36A. Also, the controller 3 controls opening degrees of the variable flow valves 39B and 39C to control the flow rates of the inert gas passing through the inert gas supply pipes 36B and 36C.

FIG. 8 is a flow diagram for describing an example of substrate processing performed by the substrate processing apparatus 1 and mainly shows a processing realized by the controller 3 executing an operation program. An unprocessed substrate W is carried into a processing unit 2 from a carrier C and transferred to the spin chuck 5 by the transfer robots IR and CR (S1). In this process, the controller 3 controls the guard elevating/lowering units 184, 185, and 186 so that the guards 181, 182, and 183 are put in the fourth state (port 0; see FIG. 2D) of being lower than a substrate holding height of the spin chuck 5. Further, the controller 3 controls the elevating/lowering unit 7 so that the heater unit 6 is disposed at the lower position. Also, the controller 3 controls the chuck pin driving unit 25 so that the chuck pins 20 are put in the open state. In that state, the transfer robot CR transfers the substrate W to the spin chuck 5. Thereafter, the substrate W is held by the spin chuck 5 (substrate holding step) until it is carried out by the transfer robot CR. The substrate W is placed on the supporting portions 52 (supporting surfaces 52a) of the chuck pins 20 in the open state. Thereafter, the controller 3 controls the chuck pin driving unit 25 to put the chuck pins 20 in the closed state. The substrate W is thereby gripped by the gripping portions 51 of the plurality of chuck pins 20.

After the transfer robot CR has retracted outside the processing unit 2, a chemical liquid processing (S2) is started. Before starting the chemical liquid processing, the controller 3 controls the guard elevating/lowering units 184, 185, and 186, for example, so that a state (the second state; see FIG. 2B) is entered where the space (port 2) between the guards 181 and 182 faces the peripheral end surface of the substrate W and the chemical liquid splashing out from above the substrate W due to centrifugal force is received by the port 2. In that state, the controller 3 drives the electric motor 23 to rotate the spin base 21 at a predetermined chemical liquid rotational speed. Meanwhile, the controller 3 controls the second nozzle moving unit 16 to position the second moving nozzle 12 at a chemical liquid processing position above the substrate W. The chemical liquid processing position may be a position at which the chemical liquid discharged from the second moving nozzle 12 lands on the rotation center of the upper surface of the substrate W. The controller 3 then opens the chemical liquid valve 43. The chemical liquid is thereby supplied from the second moving nozzle 12 toward the upper surface of the substrate W in the rotating state. The supplied chemical liquid spreads throughout an entire surface of the substrate W due to the centrifugal force. The chemical liquid that is removed to the outer side of the substrate W by the centrifugal force is received by the guard 182 and guided from the annular cup 188 to the drain piping 190.

After the chemical processing of a fixed time, a DIW rinse processing (S3) of replacing the chemical liquid on the substrate W with DIW to remove the chemical liquid from the substrate W is executed. Specifically, after closing the chemical liquid valve 43 and ending the chemical liquid processing, the controller 3 controls the guard elevating/lowering units 184, 185, and 186, for example, so that a state (the first state; see FIG. 2A) is entered where an inner surface (port 1) of the guard 181 faces the peripheral end surface of the substrate W and the chemical liquid splashing out from the substrate W due to centrifugal force is received by the port 1. The controller 3 then opens the DIW valve 47. The DIW from the DIW nozzle 10 is thereby supplied toward the upper surface of the substrate W in the rotating state. The supplied DIW spreads throughout the entire surface of the substrate W due to the centrifugal force. The chemical liquid on the substrate W is rinsed off by the DIW. During this process, the controller 3 controls the second nozzle moving unit 16 to make the second moving nozzle 12 retract from above the substrate W to a side of the cup 8.

After the DIW rinse processing of a fixed time, an organic solvent processing (S4) of replacing the DIW on the substrate W with an organic solvent, which is a processing liquid of lower surface tension (low surface tension liquid), is executed. The DIW that is removed to the outer side of the substrate W by the centrifugal force is received by the guard 181 and guided from the annular cup 187 to the drain piping 189.

The controller 3 controls the first nozzle moving unit 15 to make the first moving nozzle 11 move to an organic solvent rinse position above the substrate W. The organic solvent rinse position may be a position at which the organic solvent (for example, IPA), discharged from the central discharge port 71 (organic solvent nozzle; see FIG. 6C) included in the first moving nozzle 11, lands on the rotation center of the upper surface of the substrate W.

The controller 3 then opens the inert gas valves 38B and 38C. From the first parallel discharge port 82 and the second parallel discharge port 83 of the first moving nozzle 11, the inert gas is thereby discharged radially and parallel to the upper surface of the substrate W from the center to the peripheral edge of the substrate W. The parallel gas streams 86 and 87, which are inert gas streams that flow parallel to the upper surface of the substrate W, are thereby formed, and an entirety of the upper surface of the substrate W (to be accurate, a region at an outer side of the first moving nozzle 11 in plan view) is covered by the parallel gas streams 86 and 87 (upper surface covering step).

In that state, the controller 3 closes the DIW valve 47 to end the DIW rinse processing, and further controls the guard elevating/lowering units 184, 185, and 186, for example, so that a state (the second state; see FIG. 2C) is entered where the space (port 3) between the guards 182 and 183 faces the peripheral end surface of the substrate W and the DIW splashing out from the substrate W due to centrifugal force is received by the port 3. In that state, the controller 3 opens the organic solvent valve 37. The organic solvent (liquid) is thereby supplied from the first moving nozzle 11 (central discharge port 71) toward the upper surface of the substrate W in the rotating state. The supplied organic solvent spreads throughout the entire surface of the substrate W due to the centrifugal force and replaces the DIW on the substrate W. A liquid film of the organic solvent is thereby formed on the upper surface of the substrate W (liquid film forming step). The organic solvent that is removed to the outer side of the substrate W by the centrifugal force is received by the guard 183 and guided to the drain piping 173 coupled to the bottom portion of the exhaust bucket 17.

In the organic solvent processing, the controller 3 controls the elevating/lowering unit 7 to elevate the heater unit 6 toward the substrate W and thereby heats the substrate W. Also, the controller 3 decelerates the rotation of the spin chuck 5 to stop the rotation of the substrate W and closes the organic solvent valve 37 to stop the supplying of the organic solvent. A puddle state, in which the organic solvent liquid film is supported on the substrate W in the stationary state, is thereby entered. A portion of the organic solvent in contact with the upper surface of the substrate W evaporates due to the heating of the substrate W and a gas phase layer is thereby formed between the organic solvent liquid film and the upper surface of the substrate W. The organic solvent liquid film in the state of being supported by the gas phase layer is removed.

In removing the organic solvent liquid film, the controller 3 controls the first nozzle moving unit 15 to move the first moving nozzle 11 so that the linear stream discharge port 81 is positioned on the rotational axis A1 of the substrate W. The controller 3 then opens the inert gas valve 38A to make the inert gas be discharged rectilinearly from the linear stream discharge port 81 toward the organic solvent liquid film above the substrate W (perpendicular gas discharging step). Thereby, at the position at which the discharge of the inert gas is received, that is, at the center of the substrate W, the organic solvent liquid film is removed by the inert gas and a hole, exposing the front surface of the substrate W, is opened in a center of the organic solvent liquid film (liquid film opening step). By spreading the hole, the organic solvent above the substrate W is expelled off the substrate W (liquid film removing step). At a last stage of the liquid film removing step, the controller 3 controls the guard elevating/lowering units 184, 185, and 186 so that a state (the fourth state; see FIG. 2D) is entered where the uppermost guard 183 is set at a position lower than the height of the substrate W. A direction of the gas stream at the periphery of the substrate W is thereby changed and at the periphery of the substrate W, a downward gas stream, directed toward the innermost guard 181 (port 1), is generated. The organic solvent liquid film at an upper surface outer peripheral portion of the substrate W is dragged by the downward gas stream and removed off the substrate W.

After the organic solvent processing is thus ended, the controller 3 controls the guard elevating/lowering units 184, 185, and 186 to elevate the guard 183 to open up the space (port 3) between the guards 182 and 183 and make the space face the upper surface of the spin base 21 (see FIG. 10F). In this state, the controller 3 controls the electric motor 23 to make the substrate W undergo high-speed rotation at a drying rotational speed. A spin base drying processing (S5: spin drying) for spinning off, by the centrifugal force, the organic solvent that has dropped onto the spin base 21 is thereby performed. The organic solvent that is spun off is received by the guard 183 and drained from the drain piping 173.

Thereafter, the controller 3 controls the first nozzle moving unit 15 to retract the first moving nozzle 11 and further controls the electric motor 23 to stop the rotation of the spin chuck 5. Also, the controller 3 controls the elevating/lowering unit 7 to control the heater unit 6 to the lower position. Also, the controller 3 controls the guard elevating/lowering units 184, 185, and 186 so that the guards 181, 182, and 183 are put in the fourth state (port 0; see FIG. 2D) of being lower than the substrate holding height of the spin chuck 5. Further, the controller 3 controls the chuck pin driving unit 25 to control the chuck pins 20 to the open position. The substrate W is thereby put in a state of being placed on the supporting portions 52 from the state of being gripped by the gripping portions 51 of the chuck pins 20. Thereafter, the transfer robot CR enters into the processing unit 2, scoops up the processed wafer W from the spin chuck 5, and carries it out of the processing unit 2 (S6). The substrate W is transferred from the transfer robot CR to the transfer robot IR and is housed in a carrier C by the transfer robot IR.

Figure 9:
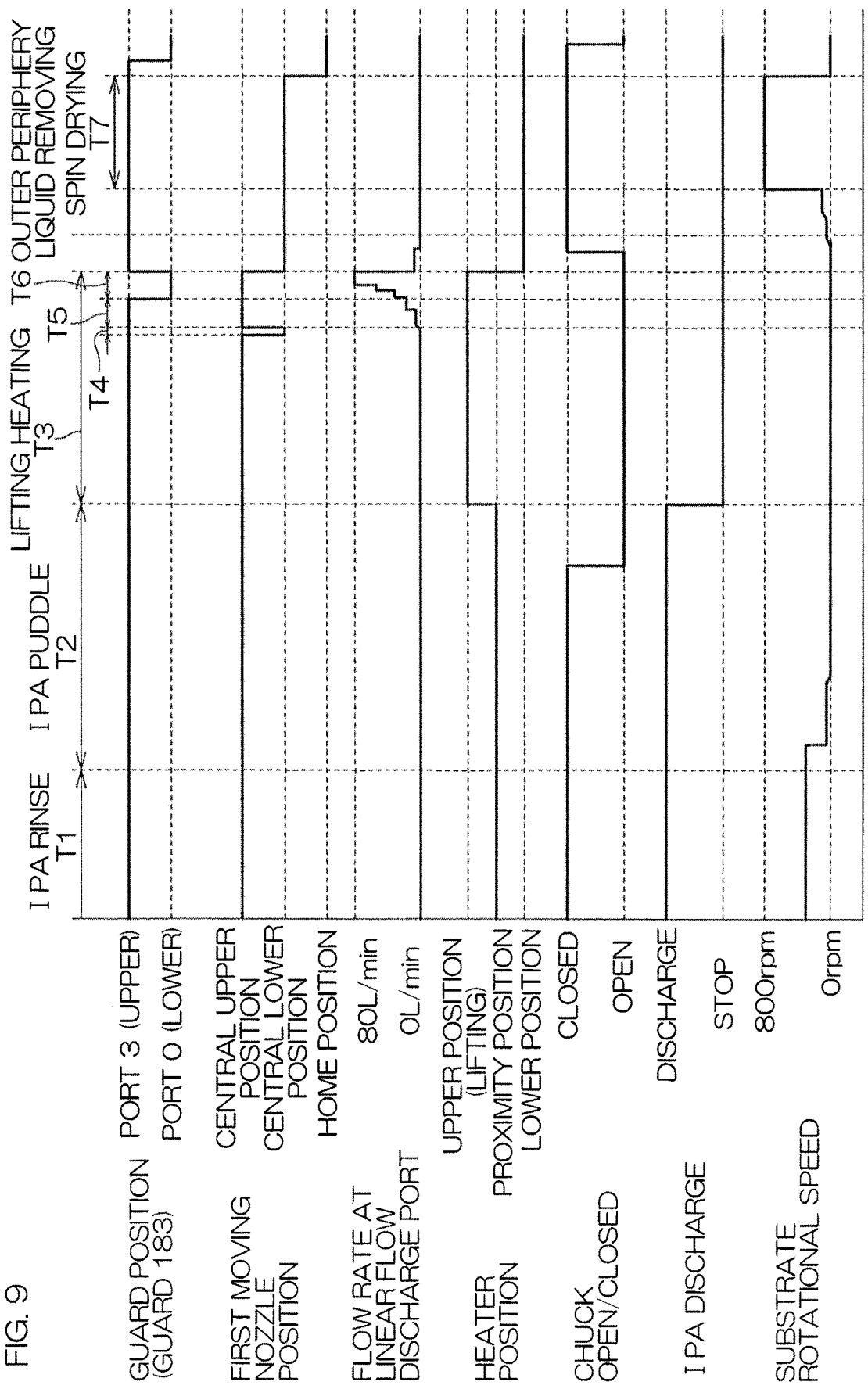
FIG. 9 is a time chart for describing details of an organic solvent processing (S4 of FIG. 8).
Figure 10A:
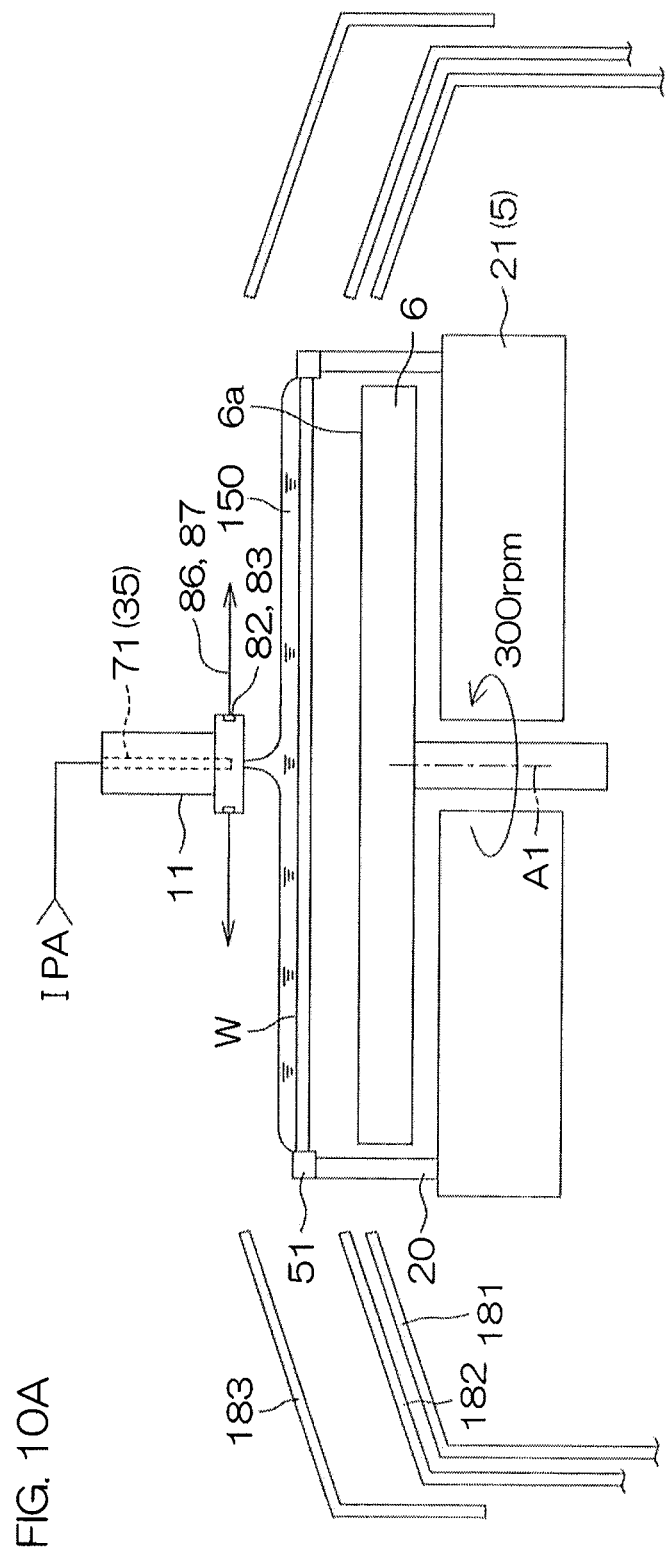

FIG. 9 is a time chart for describing details of the organic solvent processing (S4 of FIG. 8). Also, FIG. 10A to FIG. 10E are illustrative sectional views for describing conditions of the respective steps of the organic solvent processing, and FIG. 10F is an illustrative sectional view for describing conditions of the spin base drying processing (S5 of FIG. 8).

The organic solvent processing includes an organic solvent rinsing step T1, an organic solvent puddle step T2, a lifting heating step T3, a hole opening step T4, a hole spreading step T5, and an outer periphery liquid removing step T6 and these are executed successively.

The organic solvent rinsing step T1 is a step (processing liquid supplying step, organic solvent supplying step, liquid film forming step) of supplying the organic solvent to the upper surface of the substrate W while rotating the substrate W (substrate rotating step). As shown in FIG. 10A, the organic solvent (for example, IPA) is supplied to the upper surface of the substrate W from the central discharge port 71 of the first moving nozzle 11. In this process, the controller 3 puts the guards 181, 182, and 183 in the third state and makes the space (port 3) between the guards 182 and 183 face the peripheral end surface of the substrate W (guard side positioning step). Also, the controller 3 opens the inert gas valves 38B and 38C. The inert gas is thereby discharged radially from the first and second parallel stream discharge ports 82 and 83 of the first moving nozzle 11, and the upper surface of the substrate W is covered by the parallel gas streams 86 and 87 (upper surface covering step). The discharges of inert gas from the first and second parallel stream discharge ports 82 and 83 are preferably started before the organic solvent discharge from the central discharge port 71. A discharge flow rate of the inert gas from the first and second parallel stream discharge ports 82 and 83 may, for example, be approximately 100 liters/minute in total.

The organic solvent supplied from the central discharge port 71 receives the centrifugal force and is thereby directed from the center toward the outer side of the upper surface of the substrate W and forms the liquid film 150 covering the upper surface of the substrate W. By the liquid film 150 covering the entire upper surface of the substrate W, the DIW (another processing liquid) supplied to the upper surface of the substrate W in the DIW rinse processing (S3 of FIG. 8) is entirely replaced by the organic solvent. The upper surface of the substrate W is covered by the parallel gas streams 86 and 87 of inert gas and therefore liquid droplets splashing back from a processing chamber inner wall, mist in the atmosphere, etc., can be suppressed or prevented from becoming attached to the upper surface of the substrate W. The organic solvent that is removed off the substrate W by the centrifugal force is received by the guard 183 and then expelled.

During the period of the organic solvent rinsing step T1, the substrate W is rotated at an organic solvent rinse processing speed (liquid supplying speed; for example of approximately 300 rpm) by the spin chuck 5 (liquid supplying speed rotating step). The first moving nozzle 11 is positioned above the rotation center of the substrate W. The organic solvent valve 37 is put in the open state and therefore the organic solvent (for example, IPA) discharged from the central discharge port 71 is supplied from above toward the rotation center of the upper surface of the substrate W. The chuck pins 20 are put in the closed state, so that the substrate W is gripped by the gripping portions 51 and rotates together with the spin chuck 5. The heater unit 6 is position-controlled to be at a position higher than the lower position and its heating surface 6a is positioned at a proximity position separated downward by only a predetermined distance (for example, 2 mm) from the lower surface of the substrate W. The substrate W is thereby preheated by radiant heat from the heating surface 6a (substrate preheating step). The temperature of the heating surface 6a of the heater unit 6 is, for example, approximately 150° C. and is uniform within the plane. The second moving nozzle 12 is retracted at the home position at the side of the cup 8. The chemical liquid valve 43 and the inert gas valves 38A, 38C, and 44 are controlled to be in the closed states.

Figure 10B:
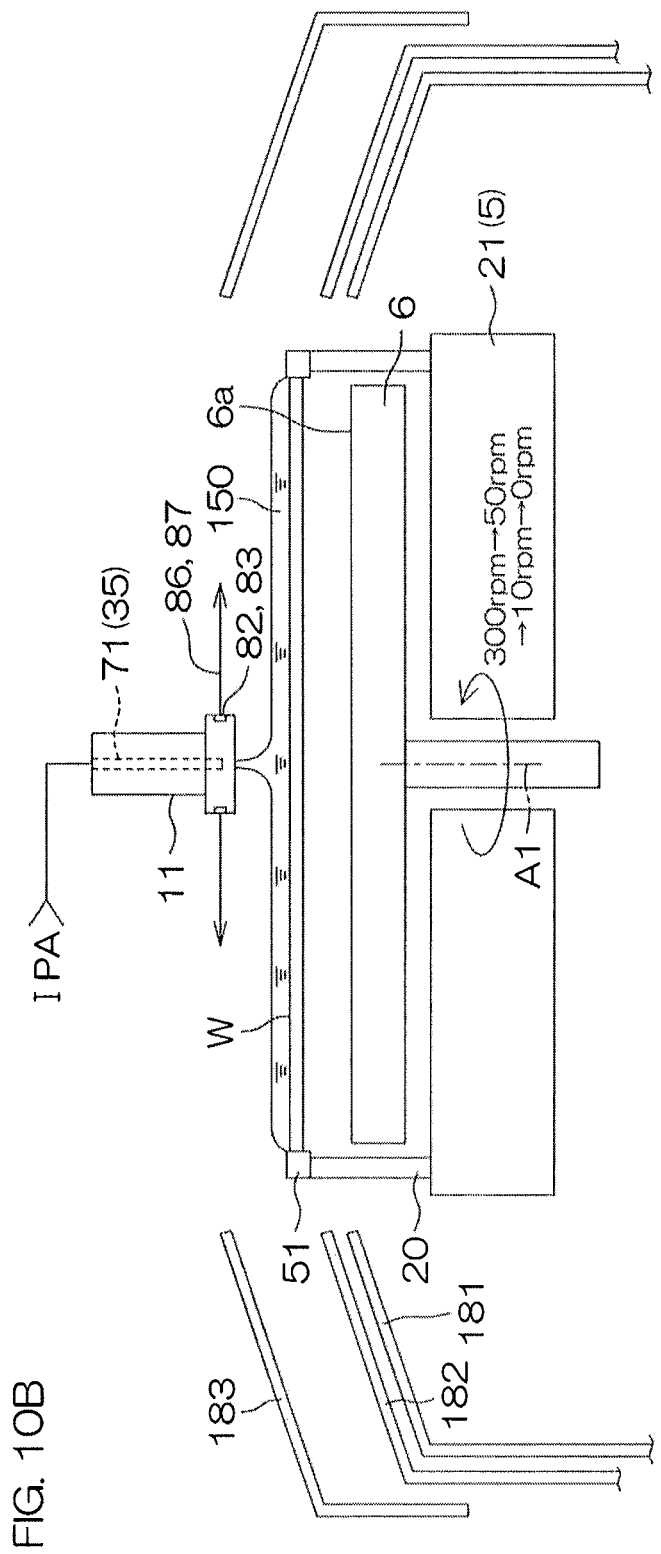

As shown in FIG. 10B, the organic solvent puddle step T2 is a step of decelerating and stopping the rotation of the substrate W to form and maintain a thick liquid film 150 of the organic solvent on the front surface of the substrate W.

In the present example, the rotation of the substrate W is decelerated stepwise from the organic solvent rinse processing speed (decelerating step, gradual decelerating step, stepwise decelerating step). More specifically, the rotational speed of the substrate W is decelerated from 300 rpm to 50 rpm and kept there for a predetermined time (for example, of 10 seconds), thereafter decelerated to 10 rpm and kept there for a predetermined time (for example, of 10 seconds), and thereafter decelerated to 0 rpm (stopped) and kept there for a predetermined time (for example, of 10 seconds). On the other hand, the first moving nozzle 11 is maintained on the rotational axis A1 and continues to discharge the organic solvent from the central discharge port 71 toward the rotation center of the upper surface of the substrate W and discharge the inert gas from the first and second parallel stream discharge ports 82 and 83 to form the parallel gas streams 86 and 87. The discharge of organic solvent from the central discharge port 71 is sustained over the entire period of the organic solvent puddle step T2. That is, the discharge of organic solvent is sustained even when the substrate W stops. By the supplying of organic solvent thus being sustained over the entire period from the deceleration to stoppage of the rotation of the substrate W, the processing liquid will not be depleted at any part of the upper surface of the substrate W. Also, by the supplying of organic solvent being sustained even after stoppage of the rotation of the substrate W, the thick liquid film 150 can be formed on the upper surface of the substrate W.

The position of the heater unit 6 is the same as the position during the organic solvent rinsing step and is the proximity position at which the heating surface 6a is separated downward by only the predetermined distance (for example, 2 mm) from the lower surface of the substrate W. The substrate W is thereby preheated by radiant heat from the heating surface 6a (substrate preheating step). After the rotation of the substrate W is stopped, the chuck pins 20 are switched from the closed state to the open state while the stopped state is maintained. A state is thereby entered where a peripheral edge portion lower surface of the substrate W is supported from below by the supporting portions 52 of the chuck pins 20 and the gripping portions 51 are separated from upper surface peripheral edge portions of the substrate W, so that the entire upper surface of the substrate W is released. The second moving nozzle 12 remains at the home position.

The positions of the guards 181, 182, and 183 in the organic solvent puddle step T2 are the same as in the case of the organic solvent rinsing step T1.

Figure 10C:
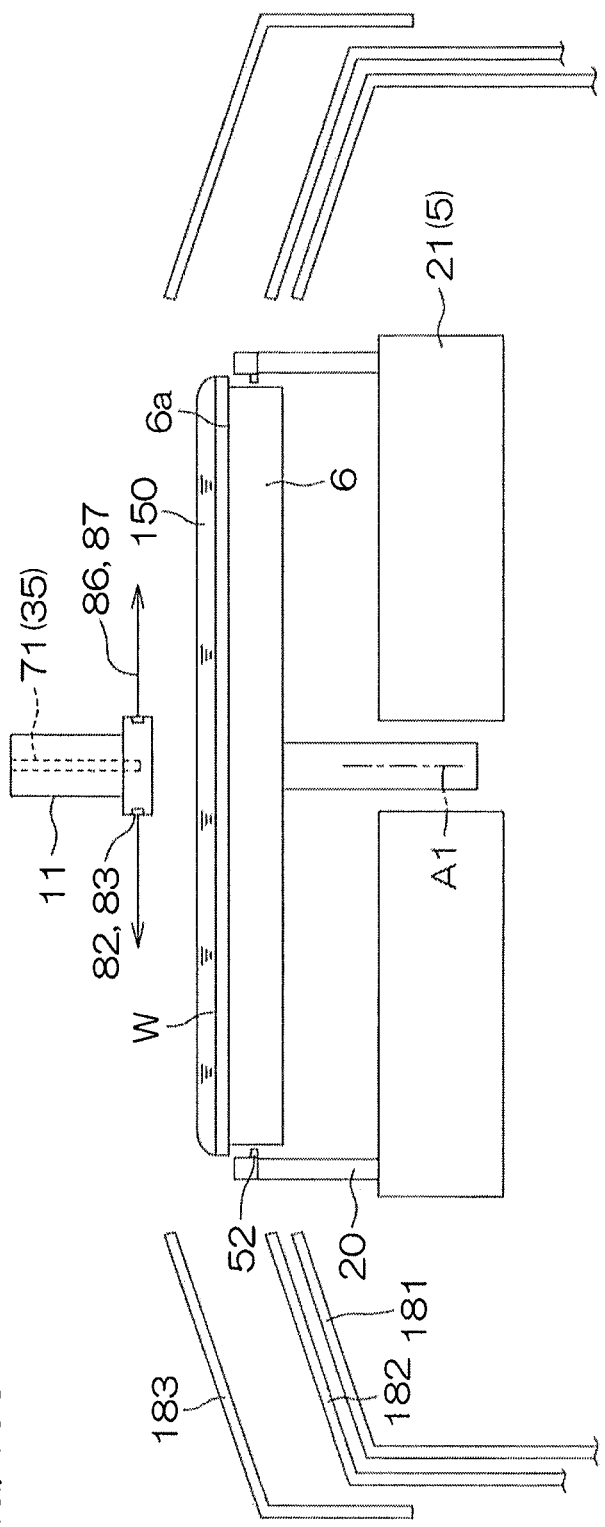

As shown in FIG. 10C, the lifting heating step T3 is a step (heating surface contacting step) in which, in a state where the substrate W is lifted by the heater unit 6, that is, in a state where the heating surface 6a is put in contact with the lower surface of the substrate W, the organic solvent liquid film 150 is maintained on the upper surface of the substrate W while heating the substrate W.

The heater unit 6 is elevated from the proximity position to the upper position and held there for a predetermined time (for example, of 10 seconds). In the process of elevating the heater unit 6 to the upper position, the substrate W is transferred from the supporting portions 52 of the chuck pins 20 to the heating surface 6a and the substrate W becomes supported by heating surface 6a (more specifically, by the supporting pins 61; see FIG. 2) (heater unit approaching step, heater unit contacting step). The discharge of organic solvent from the first moving nozzle 11 (central discharge port 71) is sustained until the substrate W is lifted by the heater unit 6 and the heater unit 6 reaches the upper position. The supplying of the organic solvent is thus sustained when the heating surface 6a of the heater unit 6 contacts the lower surface of the substrate W and rapid heating of the substrate W by heat conduction from the heating surface 6a is started to increase the heat amount applied to the substrate W (heat amount increasing step). Opening of holes at unspecified positions in the organic solvent liquid film 150 due to evaporation of the organic solvent in accompaniment with rapid temperature rise of the substrate W is thereby avoided. The supplying of the organic solvent is stopped after the heating surface 6a of the heater unit 6 contacts the lower surface of the substrate W (after the heat amount increasing step) (supply stopping step). That is, the controller 3 closes the organic solvent valve 37 to stop the discharge of organic solvent from the central discharge port 71.

The rotation of the spin chuck 5 is in the stopped state, the second moving nozzle 12 is at the home position, and the inert gas valve 44 is in the closed state. The first moving nozzle 11 (central discharge port 71) is positioned above the rotation center of the substrate W.

After the supplying of organic solvent has been stopped, the heater unit 6 is maintained at the upper position. The organic solvent supplied to the substrate W is pushed away to the outer peripheral side by the fresh organic solvent supplied to the center and, in this process, is heated and raised in temperature by the heat from the upper surface of the substrate W that is heated by the heater unit 6. In the period in which the supplying of organic solvent is sustained, the temperature of the organic solvent at a central region of the substrate W is comparatively low. Thus by stopping the supplying of the organic solvent and maintaining the contacting state of the heater unit 6, the organic solvent at the central region of the substrate W can be raised in temperature. The temperature of the organic solvent liquid film 150 supported on the upper surface of the substrate W can thereby be made uniform.

At the organic solvent liquid film 150 that receives heat from the upper surface of the substrate W, evaporation occurs at an interface with the upper surface of the substrate W. A gas phase layer, constituted of the gas of the organic solvent, is thereby formed between the upper surface of the substrate W and the organic solvent liquid film 150. The organic solvent liquid film 150 is thus put in a state of being supported on the gas phase layer throughout the entirety of the upper surface of the substrate W (gas phase layer forming step).

As shown in FIG. 10D, the hole opening step T4 is a step of blowing the linear gas stream 85 of the inert gas (for example, nitrogen gas) at a low flow rate (first flow rate, for example, of 3 liters/minute) perpendicularly toward the center of the substrate W from the linear stream discharge port 81 of the first moving nozzle 11 to open a small hole 151 in a central portion of the organic solvent liquid film 150 to thereby expose a central portion of the upper surface of the substrate W (perpendicular gas discharging step, hole opening step). The hole opening step T4 is executed in parallel to the lifting heating step T3. The linear gas stream 85 is low in flow rate and therefore splashing of liquid at the organic solvent liquid film 150 can be prevented or suppressed in opening the small hole 151 in the organic solvent liquid film 150. The rotation of the substrate W is kept in the stopped state and therefore the hole opening step is performed on the liquid film 150 above the substrate W in the stationary state. A plan view of a state where the hole is opened in the central portion of the organic solvent liquid film 150 is shown in FIG. 11A. For the sake of clarification, the organic solvent liquid film 150 is provided with hatching in FIG. 11A.

More specifically, the controller 3 controls the first nozzle moving unit 15 to lower the first moving nozzle 11 to a central lower position (close position) and bring the first moving nozzle 11 close to the substrate W while sustaining the discharges of inert gas from the first and second parallel stream discharge ports 82 and 83. The parallel gas streams 86 and 87 formed by the inert gas discharged from the first and second parallel stream discharge ports 82 and 83 are thereby brought close to the upper surface of the substrate W. Also, the controller 3 opens the inert gas valve 38A and controls the mass flow controller 39A to make the inert gas be discharged at a low flow rate from the linear stream discharge port 81. During this process, the heating surface 6a of the heater unit 6 contacts the lower surface of the substrate W, so that the substrate W is still lifted by the heater unit 6 and contact heating by the heater unit 6 is sustained.

On the other hand, when the movement of the liquid film 150 to the outer side due to the opening of the hole by the inert gas is started, the liquid film 150 moves to the outer side of the substrate W.

More specifically, in the central region in which the hole is opened and the liquid film 150 is gone, the temperature of the substrate W rises quickly in comparison to the surrounding region in which the liquid film 150 is present. A large temperature gradient thus arises within the substrate W at a peripheral edge of the hole 151. That is, the temperature becomes high at an inner side and becomes low at an outer side of the peripheral edge of the hole 151. By this temperature gradient, the organic solvent liquid film 150, supported on the gas phase layer, begins to move toward the low temperature side, that is, toward the outer side, and the hole 151 at the center of the organic solvent liquid film 150 thereby becomes enlarged.

The organic solvent liquid film 150 above the substrate W can thus be removed off the substrate W by using the temperature gradient that arises due to the heating of the substrate W (liquid film removing step, heating removing step, liquid film moving step). More specifically, at the upper surface of the substrate W, the liquid film 150 within a region in which a pattern is formed can be removed by movement of the organic solvent due to the temperature gradient.

The substrate W is heated sustainedly from before the hole 151 is formed at the rotation center of the substrate W by the blowing on of the inert gas, and therefore when the hole 151 is formed, the hole 151 begins to enlarge without stopping.

Figure 10E:
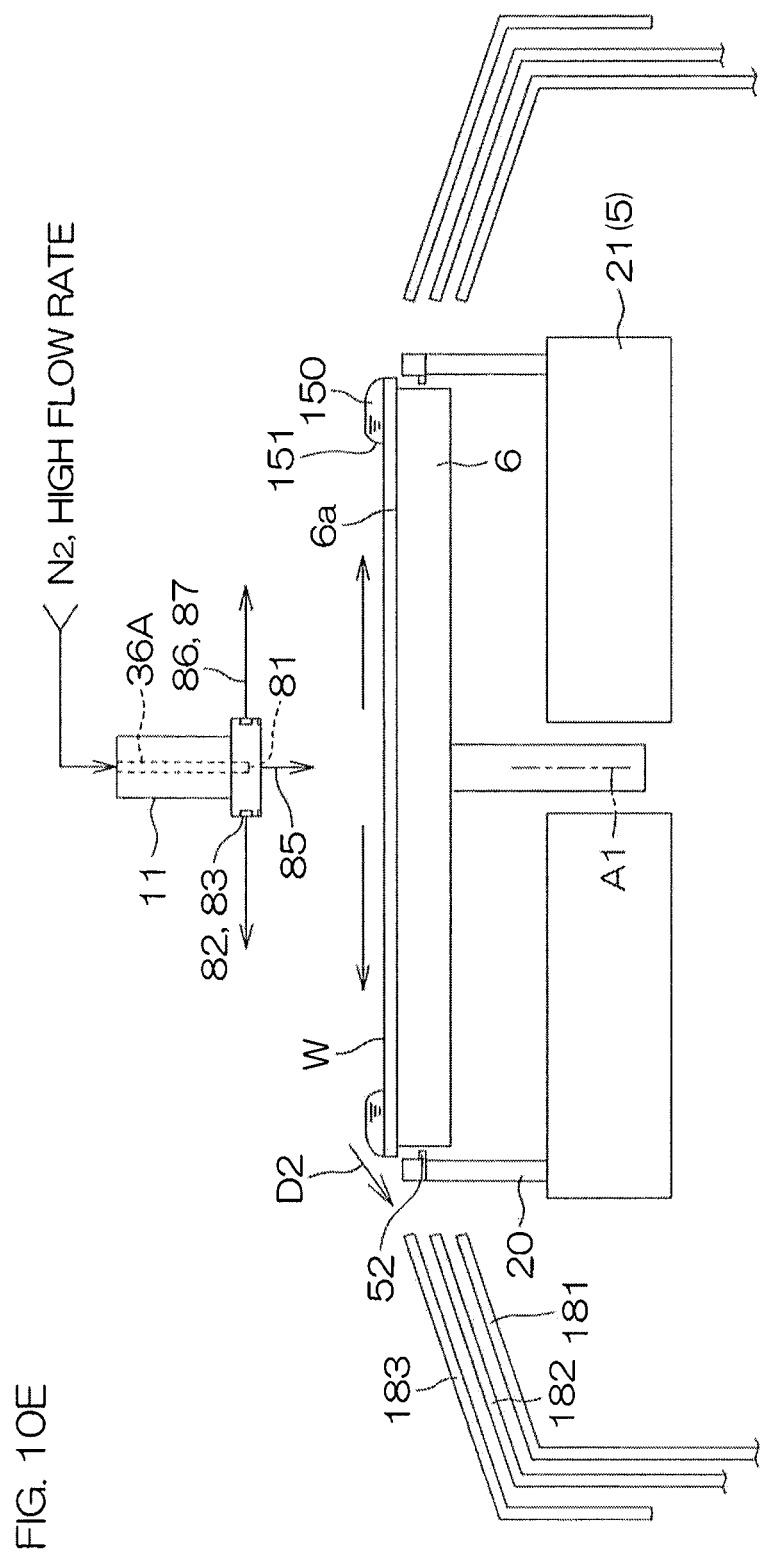

As shown in FIG. 10E, the hole spreading step T5 is a step of elevating the first moving nozzle 11 to a central upper position and increasing the flow rate of the inert gas discharged from the linear stream discharge port 81 to blow the inert gas of high flow rate (second flow rate; for example of 30 liters/minute) onto the center of the substrate W to further spread the hole 151 at the center of the organic solvent liquid film 150 by means of the inert gas (liquid film removing step, gas flow rate increasing step, gas removing step, liquid film moving step). The hole spreading step T5 is executed in parallel to the lifting heating step T3.

The controller 3 controls the mass flow controller 39A to increase the flow rate of the inert gas supplied to the second moving nozzle 12. In accordance with the increase of flow rate, the flow speed also increases. By the increase of the inert gas flow rate, the liquid film 150, which has moved to the outer peripheral region of the upper surface of the substrate W, is pushed away further and off the substrate W. The rotation of the substrate W is maintained in the stopped state. The controller 3 controls the first nozzle moving unit 15 to elevate the first moving nozzle 11 to the central upper position.

Specifically, by further increasing the flow rate of the inert gas while the hole 151 is being spread by the temperature gradient, stopping of the movement of the liquid film 150 can be avoided and the movement of the liquid film 150 to the outer side of the substrate W can be sustained. With only the movement of the organic solvent liquid film 150 using the temperature gradient, the movement of the liquid film 150 may stop at a peripheral edge region of the upper surface of the substrate W. Thus by increasing the flow rate of the inert gas, the movement of the liquid film 150 can be assisted.

However, even then, the movement of the liquid film 150 may stop at the outer peripheral portion of the upper surface of the substrate W as shown in FIG. 11B. Thus with the present preferred embodiment, the outer periphery liquid removing step T6 (gas stream direction changing step) is executed. The outer periphery liquid removing step T6 is executed in parallel to the lifting heating step T3.

In a period of the lifting heating step T3 prior to the outer periphery liquid removing step T6, the positions of the guards 181, 182, and 183 are the same as those in the organic solvent rinsing step T1 and the organic solvent puddle step T2. That is, the guards 181, 182, and 183 are in the third state and the space (port 3) between the guards 182 and 183 face the peripheral end surface of the substrate W. In this state, an upper end of the guard 183 is positioned higher than the substrate W.

As shown in FIG. 10E, in the outer periphery liquid removing step, the flow rate of the inert gas is increased (for example, increased gradually to 80 liters/minute) and meanwhile the guard 183 is lowered to a lower position (guard relative position changing step). The lower position is a position at which the upper end of the guard 183 is set at the same height as or to be lower than the substrate W. That is, the controller 3 controls the guard elevating/lowering units 184, 185, and 186 to control the guards 181, 182, and 183 to be in the fourth state (port 0). A direction of the gas stream at the outer peripheral portion of the substrate W is thereby changed. The guard elevating/lowering units 184, 185, and 186 that move the guards 181, 182, and 183 vertically thus function as gas stream direction changing units that change the direction of the gas stream at the outer peripheral portion of the substrate W.

Specifically, when the guards 181, 182, and 183 are in the third state (see FIG. 2C and FIG. 10D), a central portion of the liquid receiving portion 196 of the guard 183 faces the peripheral end surface of the substrate W and the upper end of the guard 183 is positioned higher than the substrate W. In this state, a space at the inner side (substrate W side) of the guard 183 is evacuated along the exhaust path 303 shown in FIG. 2C (evacuating step) and therefore in a vicinity of the peripheral end surface of the substrate W, an atmosphere in the vicinity of the substrate W is suctioned into the guard 183. The upper end of the guard 183 is positioned higher than the substrate W and therefore a main flow direction (average flow direction) of the gas stream in the vicinity of the outer peripheral portion of the substrate W is a direction (horizontal direction) parallel to the substrate W or a first direction D1 (see FIG. 10D) that is a direction having an upwardly directed component.

When the guard 183 is lowered and set at the lower position (guard lowering step) and the guards 181, 182, and 183 are put in the fourth state (see FIG. 2D and FIG. 10E), the upper end of the guard 183 is positioned lower than the peripheral end surface of the substrate W. In this state, the space at the inner side (substrate W side) of the guard 183 is evacuated along the exhaust path 304 shown in FIG. 2D (evacuating step) and therefore the atmosphere in the vicinity of the substrate W is suctioned by the opening (port 1) of the guard 181. Therefore with the gas stream in the vicinity of the peripheral end surface of the substrate W, a gas stream that is directed downward so as to wrap around the peripheral end surface of the substrate W is formed. In this state, the main flow direction (average flow direction) of the gas stream in the vicinity of the outer peripheral portion of the substrate W is a second direction D2 (see FIG. 10E) having a downwardly directed component. The liquid film 150 at the outer peripheral portion of the substrate W upper surface moves by being dragged by the gas stream of the second direction D2 having the downwardly directed component and is dragged down to the outer side of the substrate W. The organic solvent liquid film 150 can thereby be removed from the entirety of the upper surface of the substrate W while suppressing or preventing stagnation of movement of the liquid film 150 at the outer peripheral portion of the substrate W.

This state is maintained for only a predetermined time sufficient for removing the entirety of the organic liquid film 150. Thereafter, the controller 3 controls the guard elevating/lowering units 184, 185, and 186 to put the guards 181, 182, and 183 in the third state (see FIG. 2C and FIG. 10F). To be more accurate, the state of FIG. 10F differs from the third state and the heights of the guards 181, 182, and 183 are controlled so that the space (port 3) between the guards 182 and 183 is set at a height corresponding to the upper surface of spin base 21. To be even more accurate, in FIG. 10F, the space (port 3) between the guards 182 and 183 faces the peripheral end surface of the substrate W and the upper surface of the spin base 21 from the side. On the other hand, the heater unit 6 is lowered and the substrate W is transferred from the heating surface 6a to the supporting portions 52 of the chuck pins 20. Thereafter, the chuck pins 20 are put in the closed state and the substrate W is gripped by the gripping portions 51. By then, the supplying of the inert gas from the linear flow discharge port 81 is stopped.

Even during the outer periphery liquid removing step T6, the controller 3 maintains the inert gas valves 38B and 38C in the open states and therefore the upper surface of the substrate W is covered by the parallel gas streams 86 and 87 formed by the inert gas discharged from the first and second parallel stream discharge ports 82 and 83. The liquid film 150 above the substrate W can thus be removed while suppressing or preventing foreign matter, such as liquid droplets, mist, etc., from becoming attached to the upper surface of the substrate W.

After the substrate W is held by the spin chuck 5, a spin drying step T7 (spin base drying processing; S5 of FIG. 8) is executed as shown in FIG. 10F. The discharges of inert gas from the first parallel stream discharge port 82 and the second parallel stream discharge port 83 are sustained. The upper surface of the substrate W is thereby covered by two layers of inert gas streams that are parallel to the upper surface of the substrate W. In that state, the controller 3 accelerates the rotation of the spin chuck 5 to a drying rotational speed (for example, of 800 rpm), which is a high speed. The organic solvent that has dropped onto the upper surface of the spin base 21 in prior steps can thereby be spun off by the centrifugal force. The upper surface of the substrate W is covered by the inert gas streams, and liquid droplets, which have scattered to the surroundings and have splashed back, and mist in the periphery can thereby be prevented from becoming attached to the upper surface of the substrate W. Liquid droplets splashing out from the spin base 21 to the outer side are received by the liquid receiving portion 196 of the guard 183 and expelled upon being guided to the drain piping 173.

After the spin drying step T7, the rotation of the spin chuck 5 is stopped. Also, the inert gas valves 38B and 38C are closed and the discharges of inert gas from the first parallel stream discharge port 82 and the second parallel stream discharge port 83 are stopped. The first moving nozzle 11 is moved to the home position. Thereafter, the controller 3 controls the guards 181, 182, and 183 to be in the fourth state (see FIG. 2D), puts the chuck pins 20 in the open state, and makes the processed substrate W be carried out from the processing unit 2 by means of the transfer robot CR.

FIG. 12A and FIG. 12B are illustrative sectional views for describing the forming of the gas phase layer on the front surface of the substrate W. A fine pattern 161 is formed on the front surface of the substrate W. The pattern 161 includes fine projecting structures 162 formed on the front surface of the substrate W. The structures 162 may include an insulator film or may include a conductor film. Also, the structures 162 may be laminated films formed by laminating a plurality of films. If line-shaped structures 162 are adjacent to each other, a groove is formed therebetween. In this case, a width W1 of each structure 162 may be approximately 10 nm to 45 nm and a mutual interval W2 between structures 162 may be approximately 10 nm to several µm. A height of each structure 162 may, for example, be approximately 50 nm to 5 µm. If the structure 162 is cylindrical, a hole is formed at the inner side thereof.

the organic solvent puddle step T2, as shown in FIG. 12A, the organic solvent liquid film 150 formed on the front surface of the substrate W fills an interior (a space between adjacent structures 162 or an internal space of a cylindrical structure 162) of the pattern 161.

In the lifting heating step T3, the substrate W is heated by contact of the heating surface 6a of the heater unit 6 with the substrate W, and its temperature becomes higher than a boiling point of the organic solvent (82.4° C. in the case of IPA) by only a predetermined temperature (for example, 10 to 50° C.). The organic solvent in contact with the front surface of the substrate W thus evaporates and a gas of the organic solvent is generated to form a gas phase layer 152 as shown in FIG. 12B. The gas phase layer 152 fills the interior of the pattern 161 and further reaches an outer side of the pattern 161 to form an interface 155 (gas-liquid interface) with the organic solvent liquid film 150 at a position higher than upper surfaces 162A of the structures 162. The organic solvent liquid film 150 is supported on the interface 155. In this state, a liquid surface of the organic solvent is not in contact with the pattern 161 and therefore pattern collapse due to surface tension of the organic solvent liquid film 150 does not occur.

When the organic solvent evaporates due to heating of the substrate W, the organic solvent of the liquid phase is expelled instantaneously from inside the pattern 161. The organic solvent of the liquid phase is then supported on the formed gas phase layer 152 and is separated from the pattern 161. The gas phase layer 152 of the organic solvent is thus interposed between the upper surface of the pattern 161 (the upper surfaces 162A of the structures 162) and the organic solvent liquid film 150 and supports the organic solvent liquid film 150.

As shown in FIG. 12C, when a crack 153 forms in the organic solvent liquid film 150 that is floated from the upper surface of the substrate W, this becomes a cause of a defect, such as a watermark, etc., after drying, and the behavior of the liquid film 150 becomes unstable and may bring about pattern collapse. Therefore in the present preferred embodiment, the supplying of the organic solvent is stopped after stopping the rotation of the substrate W to form a thick organic solvent liquid film 150 on the substrate W and to avoid the formation of a crack. When the heater unit 6 is put in contact with the substrate W, the rotation of the substrate W is stopped, so that the liquid film 150 will not become split due to the centrifugal force and the formation of a crack in the liquid film 150 can thus be avoided. Further, the output of the heater unit 6 is adjusted so that a vapor of the organic solvent will not break and blow out through the liquid film 150 and the formation of a crack is thereby avoided.

In the state where the organic solvent liquid film 150 is supported on the gas phase layer 152, a frictional resistance acting on the organic solvent liquid film 150 is small enough to be treated as zero. The organic solvent liquid film 150 is thus easily moved when a force in a direction parallel to the upper surface of the substrate W is applied to the organic solvent liquid film 150. In the present preferred embodiment, a hole is opened in the center of the organic solvent liquid film 150 to thereby cause a flow of the organic solvent to be formed by the temperature difference at the edge portion of the hole 151 and the liquid film 150 is pushed out from the inner side by the inert gas blown out from the linear stream discharge port 81 to move the organic solvent liquid film 150 supported on the gas phase layer 152. Further, in the process of spreading the hole 151, the guard 183 is lowered and the direction of the gas stream in the vicinity of the peripheral end surface of the substrate W is thereby changed to a downward direction (second direction D2; see FIG. 10E). The downwardly directed gas stream gives rise to a force that drags down the liquid film 150. Stagnation of the liquid film 150 at the outer peripheral portion of the substrate W can thereby be suppressed or prevented and the entire liquid film 150 can be removed off the substrate W in a bulk state while suppressing or preventing stopping of the movement of the liquid film 150 in the middle.

As described above, with the present preferred embodiment, after the DIW rinse processing, the DIW on the front surface of the substrate W is replaced by the organic solvent to form the organic solvent liquid film 150 that covers the entire upper surface of the substrate W. The rotation of the substrate W is decelerated and stopped while maintaining the state where organic solvent liquid film 150 covers the entire upper surface of the substrate W. The supplying of the organic solvent is sustained until the rotation of the substrate W stops and the heater unit 6 further contacts the lower surface of the substrate W, and the supplying of the organic solvent is stopped thereafter. The thick liquid film 150 of the organic solvent is thereby formed on the upper surface of the substrate W and a crack does not form in the liquid film 150 even upon rapid temperature rise of the substrate W due to contacting of the heater unit 6. The gas phase layer 152 of the organic solvent is thus formed between the upper surface of the substrate W and the liquid film 150 throughout the entire upper surface of the substrate W by the heating of the substrate W by means of the heater unit 6 while constantly keeping the state where the organic solvent liquid film 150 covers the upper surface of the substrate W. The gas phase layer 152 fills the interior of the pattern on the front surface of the substrate W and has an interface with the liquid film 150 at a position higher than the upper surface of the pattern. A liquid surface of the organic solvent is thus not present inside the pattern and therefore surface tension is not applied to the pattern. Therefore by the liquid film 150, in the state of being supported by the gas phase layer 152, being removed off the substrate W, pattern collapse can be suppressed or prevented.

In the present preferred embodiment, in removing the liquid film 150, the linear gas stream 85 of inert gas is discharged in the direction perpendicular to the upper surface of the substrate W toward the center of the film and the single hole 151 is thereby formed. The single hole 151 is pressingly spread toward the outer side by the movement of the liquid film 15 due to the temperature gradient and the high flow rate supplying of inert gas. In this process, the rotation of the substrate W is stopped and therefore the liquid film 150 moves on the gas phase layer 152 to the outer side of the substrate W and becomes removed off the substrate W while maintaining a large thickness and without splitting. In addition to the temperature gradient, the movement of the liquid film 150 is assisted by the high flow rate supplying of inert gas and therefore the movement of the liquid film 150 does not stop in the middle and the organic solvent does not return to the inner side of the substrate W to form its liquid surface inside a pattern. Pattern collapse in the process of removing the organic solvent liquid film 150 can thereby be avoided.

Further, the liquid film 150 that has been pushed away to the outer peripheral region is dragged off the substrate W by the gas stream that has been changed in direction by the lowering of the guard 183 and is thereby removed off the substrate W while suppressing or preventing stagnation. The liquid film 150 is thereby removed completely from the front surface of the substrate W. During this process, the heating 6a of the heater unit 6 remains in contact with the rear surface of the substrate W and therefore all of the liquid film 150 can be removed off the substrate W while reliably maintaining the gas phase layer 152. Moreover, the rotation of the substrate W is stopped and therefore decreases of the temperatures of the liquid film 150 and the substrate W due to heat exchange of the liquid film 150 and the atmosphere can be suppressed. The gas phase layer 152 is maintained reliably thereby as well. Further, the flow rate of the inert gas blown onto the upper surface of the substrate W does not have to be increased so much so that there is concern for decrease of the temperature of the liquid film 150 or the substrate W. The gas phase layer 152 can be maintained reliably while suppressing temperature decreases of the liquid film 150 and the substrate W thereby as well.

Also, the temperature of the substrate W can be raised quickly because the substrate W is heated with the heating surface 6a of the heater unit 6 being put in contact therewith, and accordingly, the gas phase layer 152 can be formed quickly on the substrate W. The time during which the gas-liquid interface of the organic solvent contacts the fine pattern on the substrate W can thereby be shortened and collapse of the fine pattern can thus be suppressed further. In addition, the heating time can be shortened and therefore productivity can be improved.

The organic solvent liquid film 150 is maintained in the state of covering the entire upper surface of the substrate W until the gas phase layer 152 is formed and thereafter, when removal from above the substrate W is started, is guided to the outer side of the substrate W without splitting or stopping. The liquid components on the substrate W can thereby be removed while effectively suppressing or preventing the collapse of the pattern on the substrate W.

Also, the inert gas is discharged from the first and second parallel stream discharge ports 82 and 83 from before the start of discharge of the organic solvent and the parallel gas streams 86 and 87 covering the upper surface of the substrate W are formed thereby. The formation and removal of the liquid film 150 of the organic solvent can thereby be performed while avoiding the attachment of splashed-back liquid and mist in the atmosphere onto the front surface of the substrate W. Substrate processing of high quality can thereby be realized.

Also with the present preferred embodiment, the direction of the gas stream in the vicinity of the outer peripheral portion of the substrate W can be changed by changing the position of the guard 183 that is arranged to receive the organic solvent. A part dedicated to changing the direction of the gas stream thus does not have to be provided. Moreover, the guard 183 arranged to receive the processing liquid removed from the rotating substrate W faces the entirety of the peripheral end surface of the substrate W and therefore the direction of the gas stream can be changed similarly throughout an entire perimeter of the periphery of the substrate W by moving the guard 183 vertically. Stagnation of the organic solvent at the outer peripheral portion of the substrate W can thereby be suppressed or avoided even more reliably.

Also with the present preferred embodiment, the upper end height of the guard 183 is lowered to the height not higher than the height of the substrate W when removing the organic solvent off the substrate W. The gas stream that is directed downward from the peripheral end surface of the substrate W can thereby be formed and therefore the organic solvent liquid film 150 can be dragged down from the upper surface of the substrate W. The stagnation of the liquid film 150 at the outer peripheral portion of the substrate W can thereby be avoided more effectively by using the gas stream and gravity.

Also with the present preferred embodiment, the changing of the gas stream direction by the lowering of the guard 183 is executed in parallel to the increasing of the flow rate of the inert gas. The stopping of the movement of the liquid film 150 above the substrate W can thereby be suppressed more reliably.

Also with the present preferred embodiment, the changing of the gas stream direction by the lowering of the guard 183 is started later than the start of increase of the inert gas flow rate. The direction of the gas stream is thereby changed in the state where the organic solvent has been mostly removed and the hole 151 has been spread to the outer peripheral portion of the substrate W, and the gas stream that is changed in direction acts effectively on the liquid film 150 remaining at the outer peripheral portion of the substrate W. The stopping of the movement of the organic solvent liquid film 150 can thereby be suppressed more reliably.

Also with the present preferred embodiment, the changing of the gas stream direction by the lowering of the guard 183 is executed after the opening of the hole 151 in the organic solvent liquid film 150. Splitting of the liquid film 150 due to the force that the gas stream applies to the liquid film 150 can thereby be avoided and the liquid film 150 can be removed while enlarging the hole 151 by means of the gas stream. The stopping of the movement of the liquid film 150 can thereby be suppressed reliably while avoiding the splitting of the liquid film 150.

Also, with the present preferred embodiment, the hole 151 is opened in the liquid film 150 by positioning the first moving nozzle 11 at the central lower position (close position) of being brought close to the upper surface of the substrate W and discharging the inert gas from the first moving nozzle 11. In spreading the hole 151, the first moving nozzle 11 is elevated to the central upper position (gas removing position) and the inert gas is discharged from the central upper position. By thereby discharging the inert gas at the position close to the substrate W, the hole 151 can be opened in the liquid film 150 by an inert gas of low flow rate. Loss of the gas phase layer 152 in the hole opening step T4 can thereby be avoided. On the other hand, when the hole 151 is to be spread, the inert gas is discharged from the central upper position (gas removing position) away from the substrate W. The loss of the gas phase layer 152 can thereby be suppressed even when the flow rate of the inert gas is increased and therefore the movement of the liquid film 150 on the gas phase layer 152 can be assisted by the inert gas.

FIG. 13A and FIG. 13B are illustrative sectional views for describing the arrangement of a processing unit according to another preferred embodiment of the present invention and show another example of a gas stream direction changing step. In the present arrangement example, two guards 221 and 222 are provided. A space at an inner side of the guard 221 is evacuated via an exhaust duct 223 and a space at an inner side of the guard 222 is evacuated via an exhaust duct 224. The exhaust ducts 223 and 224 are coupled to a main exhaust duct 226 via an exhaust switching unit 225. The exhaust switching unit 225 includes, for example, a valve. The main exhaust duct 226 is connected to exhaust equipment (not shown) of a plant. The exhaust ducts 223 and 224 and the main exhaust duct 226 are included in an exhaust unit that evacuates the inner sides of the guards 221 and 222.

The exhaust switching unit 225 connects the exhaust ducts 223 and 224 alternatively to the main exhaust duct 226. An exhaust path of an atmosphere at the substrate W is thereby switched between an exhaust path 231, passing through between the guards 221 and 222, and an exhaust path 232, passing through the inner side of the guard 221.

A state where the space between the guards 221 and 222 is made to face the peripheral end surface of the substrate W and the exhaust duct 224 is put in communication with the main exhaust duct 226 is shown in FIG. 13A. In this state, the main flow direction (average flow direction) of the gas stream in the vicinity of the outer peripheral portion of the substrate W is a first direction D11 directed toward a liquid receiving surface 222a of the guard 221 from the peripheral end surface of the substrate W and is, for example, substantially horizontal.

On the other hand, a state where the exhaust duct 223 is put in communication with the main exhaust duct 226 while the configuration of the guards 221 and 222 is made the same as in FIG. 13A is shown in FIG. 13B. In this state, the main flow direction (average flow direction) of the gas stream in the vicinity of the outer peripheral portion of the substrate W is a second direction D12 that is directed downward from the peripheral end surface of the substrate W. By the gas stream flowing in the second direction D12, the liquid film 150 at the outer peripheral portion of the substrate W is dragged to the outer side of the substrate W and made to flow downward.

As described above, with the present preferred embodiment, the flow direction of the gas stream in the vicinity the outer peripheral portion of the substrate W is changed not by changing the positions of the guards 221 and 222 but by switching the exhaust path. With the present preferred embodiment, the guard 222 is disposed so as to cover the peripheral end surface of the substrate W from the side even after the exhaust path is switched and therefore a merit that processing can be performed in a state where the vicinity of the substrate W is protected is provided. With the present preferred embodiment, the exhaust switching unit 225 functions as the gas stream direction changing unit that changes the direction of the gas stream at the outer peripheral portion of the substrate W.

Although preferred embodiments of the present invention have been described above, the present invention may be implemented in yet other modes. For example, with each of the preferred embodiments described above, the direction of the gas stream in the vicinity of the outer periphery of the substrate W is changed to execute the outer periphery liquid removing step T6 at the last stage of the lifting heating step T3. However, after the rotation of the substrate W is stopped, a centrifugal force does not act on the liquid film 150 on the substrate W and therefore there is no need to receive the liquid by means of the guard 183 and the guard 183 can thus be lowered. The guard 183 may thus be lowered to change the direction of the gas stream in the vicinity of the outer peripheral portion of the substrate W, for example, at any timing from the point at which the rotation of the substrate W stops (the middle of the organic solvent puddle step T2 in the example of FIG. 9) to the point at which the hole 151 of the liquid film 150 spreads to the outer peripheral portion of the substrate W.

Also, with the first preferred embodiment described above, the outer periphery liquid removing step T6 is executed upon lowering the guard 183 so that the upper end of the guard 183 is made lower than the substrate W. However, the upper end of the guard 183 at the lower position may be at the same height as or higher than the substrate W. By lowering the guard 183 from a certain position, the direction of the gas stream in the vicinity of the outer peripheral portion of the substrate W is directed further downward than the direction prior to the lowering of the guard 183. By such change of the gas stream direction, the force acting on the liquid film 150 at the substrate W outer peripheral portion is increased and the liquid film 150 can thus be moved toward the outer side of the substrate W. The direction of the gas stream after the change of direction does not necessarily have to be a direction directed downward with respect to the horizontal plane and may be the horizontal direction or a direction directed further upward than the horizontal direction. However, the force by which the liquid film 150 is dragged down by the gas stream is made stronger when the direction of the gas stream after the change of direction is a direction that is directed downward with respect to the horizontal plane.

Also, with each of the preferred embodiments described above, the heating surface 6a of the heater unit 6 contacts the substrate W in the outer periphery liquid removing step T6 performed by changing the gas stream direction. However, the outer periphery liquid removing step T6 may be executed with the heater unit 6 being in a non-contacting state with respect to the substrate W. In this case, the substrate W may be held by the spin chuck 5 and the substrate W may be rotated at a low speed such that the liquid film 150 does not scatter to the periphery.

Also, although with the first preferred embodiment described above, the gas stream direction is changed by lowering the guard 183 with respect to the substrate W, for example, the heater unit 6 may be elevated to change the height of the substrate W without changing the height of the guard 183. For example, the direction of the gas stream at the outer peripheral portion of the substrate W can be directed downward by elevating the substrate W to a position higher than the upper end of the guard 183.

Also as the inert gas, clean air or other inert gas besides nitrogen gas may be adopted. Further the substrate to be processed does not have to be circular and may be a rectangular substrate. Also, as examples of an organic solvent other than IPA that may be used, methanol, ethanol, acetone, and HEF (hydrofluoroether) can be cited. All of these are organic solvents that are lower in surface tension than water (DIW).

While preferred embodiments of the present invention have been described in detail above, it is to be understood that variations and modifications will be apparent to those skilled in the art without departing the scope and spirit of the present invention. The scope of the present invention, therefore, is to be determined solely by the following claims.

The present application corresponds to Japanese Patent Application No. 2016-072093 filed on Mar. 31, 2016 in the Japan Patent Office, and the entire disclosure of this application is incorporated herein by reference.

What is claimed is:

1. A substrate processing method comprising:
a liquid film forming step of supplying a processing liquid to an upper surface of a horizontally-held substrate to form a liquid film of the processing liquid covering an entirety of the upper surface of the substrate;
a gas phase layer forming step of heating the substrate by a heater to evaporate the processing liquid in contact with the upper surface of the substrate, to form a gas phase layer between the upper surface of the substrate and the processing liquid and maintain the liquid film on the gas phase layer;
a gas removing step of blowing a gas onto the liquid film at the upper surface of the substrate after the forming of the gas phase layer to partially remove the processing liquid to open a hole in the liquid film and further spread the hole to an outer periphery of the substrate, and to move the liquid film on the gas phase layer, to remove the processing liquid, constituting the liquid film, off the substrate;
a gas stream direction changing step whereby a direction of a gas stream, which, in a vicinity of an outer peripheral portion of the substrate, flows toward an outer side of the substrate, is changed from a first direction to a second direction different from the first direction to promote movement of the liquid film at the outer peripheral portion of the substrate and urge the removal of the liquid film off the substrate; and
a guard positioning step of positioning a guard, which surrounds the substrate and receives the processing liquid removed from the substrate, such that an upper end height of the guard becomes higher than a height of the substrate at the start of the gas removing step,
wherein the gas stream direction changing step includes a step of lowering the guard such that the upper end height of the guard becomes not higher than the height of the substrate to change the direction of the gas stream, which, in the vicinity of the outer peripheral portion of the substrate, flows toward an outer side of the substrate, from the first direction to the second direction, when a periphery of the hole reaches the outer peripheral portion of the substrate, and
the second direction includes a component directed more downwardly than a horizontal direction.

2. The substrate processing method according to claim 1, further comprising:
a substrate rotating step of rotating the substrate; and
an evacuating step of evacuating an inner side of the guard, and
wherein the gas stream direction changing step further includes a step of sustaining the evacuating step in a state where the substrate rotating step is ended and the rotation of the substrate is stopped.

3. The substrate processing method according to claim 1, wherein
a plurality of the guards are provided concentrically,
the guard positioning step includes a step of positioning a part of the plurality of the guards such that the upper end height of the part of the plurality of the guards becomes not higher than the height of the substrate at the start of the gas removing step, and
the gas stream direction changing step includes a step of changing the position of plurality of the guards such that the upper end heights of all the guards become not higher than the height of the substrate to change the direction of the gas stream, which, in the vicinity of the outer peripheral portion of the substrate, flows toward the outer side of the substrate, from the first direction to the second direction.

4. The substrate processing method according to claim 1, wherein the heater has a heating surface arranged so as to be contactable and separatable from a lower surface of the substrate,
the gas phase layer forming step includes a heating surface contacting step of putting the heating surface of the heater in contact with the lower surface of the substrate, and the heating surface contacting step is sustained until the liquid film of the processing liquid is removed from the front surface of the substrate.

5. The substrate processing method according to claim 1, wherein the gas removing step includes a gas flow rate increasing step of increasing a flow rate of the gas.

6. The substrate processing method according to claim 5, wherein the gas stream direction changing step is executed in parallel to the gas flow rate increasing step.

7. The substrate processing method according to claim 5, wherein the gas stream direction changing step is started later than the start of the gas flow rate increasing step.

8. The substrate processing method according to claim 1, wherein the gas stream direction changing step is executed later than the opening of a hole in the liquid film of the processing liquid.

9. The substrate processing method according to claim 1, wherein
the gas removing step includes
a step of opening a hole in the liquid film by positioning a nozzle, which discharges the gas, at a close position of being brought close to the upper surface of the substrate and discharging the gas from the nozzle, and
a step of spreading the hole by positioning the nozzle at a gas removing position which is higher than the close position and discharging the gas from the nozzle.

10. A substrate processing method comprising:
a liquid film forming step of supplying a processing liquid to an upper surface of a horizontally-held substrate to form a liquid film of the processing liquid covering an entirety of the upper surface of the substrate, while rotating the substrate;
a gas phase layer forming step of heating the substrate by a heater to evaporate the processing liquid in contact with the upper surface of the substrate, to form a gas phase layer between the upper surface of the substrate and the processing liquid and maintain the liquid film on the gas phase layer;
a gas removing step of blowing a gas onto the liquid film at the upper surface of the substrate, in a state where the rotation of the substrate is stopped, after the forming of the gas phase layer, to partially remove the processing liquid to open a hole in the liquid film and further spread the hole to an outer periphery of the substrate, and to move the liquid film on the gas phase layer, to remove the processing liquid, constituting the liquid film, off the substrate; and
a gas stream direction changing step whereby an outer peripheral gas stream direction which is a direction of a gas stream, which, in a vicinity of an outer peripheral portion of the substrate, flows toward an outer side of the substrate, is changed from a first direction to a second direction different from the first direction by switching a path exhausting an atmosphere in the vicinity of the substrate such that a first exhaust path, which evacuates an atmosphere in the vicinity of the substrate such that the outer peripheral gas stream direction becomes the first direction, is formed at the start of the gas removing step, and a second exhaust path, which evacuates the atmosphere in the vicinity of the substrate such that the outer peripheral gas stream direction becomes the second direction, is formed when a periphery of the hole reaches the outer peripheral portion of the substrate, wherein the second direction includes a component directed more downwardly than a horizontal direction.

11. The substrate processing method according to claim 10, wherein the gas removing step includes a gas flow rate increasing step of increasing a flow rate of the gas, and the gas stream direction changing step is executed in parallel to the gas flow rate increasing step.

12. The substrate processing method according to claim 11, wherein the gas stream direction changing step is started later than the start of the gas flow rate increasing step.

13. The substrate processing method according to claim 10, wherein the rotation of the substrate is stopped after the rotation of the substrate is gradually decreased in the liquid film forming step.

14. The substrate processing method according to claim 10, further comprising:

a guard positioning step of positioning a plurality of guards concentrically, which surround the substrate and receive the processing liquid removed to outer side from the substrate, wherein the plurality of the guards are positioned such that an upper end height of a part of the plurality of the guards becomes higher than the height of the substrate to form the first exhaust path, the plurality of the guards are positioned such that the upper end heights of all the guards become not higher than the height of the substrate to form the second exhaust path, and the gas stream direction changing step includes a step of changing the position of the plurality of guards from a position, in which the upper end height of a part of the plurality of the guards is higher than the height of the substrate, to a position, in which the upper end heights of all the guards are not higher than the height of the substrate, to switch the path exhausting the atmosphere in the vicinity of the substrate from the first exhaust path to the second exhaust path.

15. The substrate processing method according to claim 10, further comprising:

a guard positioning step of positioning, concentrically, a first guard which surrounds the substrate and receives the processing liquid removed from the substrate, and a second guard which surrounds the substrate at an inner side than the first guard and receives the processing liquid removed from the substrate, wherein a first space between the first guard and the second guard is communicated with a space in a main exhaust duct to form the first exhaust path, a second space inward of the second guard is communicated with the space in the main exhaust duct to form the second exhaust path, and the gas stream direction changing step includes a step of changing a space communicated with the space in the main exhaust duct from the first space to the second space to switch the path exhausting the atmosphere in the vicinity of the substrate from the first exhaust path to the second exhaust path.

* * * * *